US 6,729,738 B2

(12) United States Patent
Fuwausa et al.

(10) Patent No.: US 6,729,738 B2
(45) Date of Patent: May 4, 2004

(54) ILLUMINATION DEVICES FOR WATCHES AND OTHER INSTRUMENTS

(75) Inventors: Michelle Jillian Fuwausa, Columbia, MD (US); James L. Thompson, Arlington, TX (US)

(73) Assignee: Luminary Logic Ltd., Columbia, MD (US)

( * ) Notice: Subject to any disclaimer, the term of this patent is extended or adjusted under 35 U.S.C. 154(b) by 0 days.

(21) Appl. No.: 10/139,660

(22) Filed: May 3, 2002

(65) Prior Publication Data

US 2002/0176245 A1 Nov. 28, 2002

Related U.S. Application Data

(60) Provisional application No. 60/288,330, filed on May 3, 2001, provisional application No. 60/298,984, filed on Jun. 18, 2001, and provisional application No. 60/315,323, filed on Aug. 28, 2001.

(51) Int. Cl.⁷ ................................................. F21V 9/16
(52) U.S. Cl. ........................ 362/84; 362/23; 250/461.1
(58) Field of Search ........................ 250/458.1, 461.1, 250/462.1, 463.1, 465.1, 466.1, 483.1; 40/542, 543; 368/24, 67, 227; 362/84, 23, 85, 800, 28, 30, 29, 806, 490, 493

(56) References Cited

U.S. PATENT DOCUMENTS

| 3,749,977 | A |   | 7/1973  | Sliker |
| 4,208,869 | A |   | 6/1980  | Hanaoka |
| 4,775,964 | A | * | 10/1988 | Alessio et al. ................. 362/23 |
| 4,841,155 | A | * | 6/1989  | Ushida et al. ............ 250/463.1 |
| 5,029,046 | A |   | 7/1991  | Kameda |
| 5,117,334 | A |   | 5/1992  | Kameda |
| 5,130,548 | A | * | 7/1992  | Sano et al. ............... 250/461.1 |
| 5,813,753 | A |   | 9/1998  | Vriens et al. |
| 5,962,971 | A |   | 10/1999 | Chen |
| 5,997,161 | A |   | 12/1999 | Stringfellow et al. |
| 6,106,127 | A | * | 8/2000  | Fuwausa ...................... 362/29 |
| 6,208,591 | B1 |  | 3/2001  | Sakurazawa et al. |
| 6,299,321 | B1 |  | 10/2001 | Fuwausa |
| 6,402,354 | B1 | * | 6/2002 | Tatewaki et al. ............ 362/490 |

FOREIGN PATENT DOCUMENTS

JP          4-346388    * 12/1992 ........... G09F/13/42

* cited by examiner

Primary Examiner—Sandra O'Shea
Assistant Examiner—Bao Q. Truong
(74) Attorney, Agent, or Firm—Gottlieb, Rackman & Reisman, P.C.

(57) ABSTRACT

A UV emitter is incorporated into a variety of different illumination devices suitable for illuminating indicia associated with dials on watches, gauges and other instruments, as well as ornaments. The indicia is made of a material responsive to UV emissions to render the indicia visible. The devices may be used in motor vehicles and other devices. In addition, a conductor arrangement is also provided that can be used to support the UV emitter under the transparent cover of watches or gauges, with the UV emitter oriented to direct the UV emissions toward the indicia. Embodiments are presented for UV emitters on top of dials with indicia, laterally from the dials, or even under the dials.

20 Claims, 29 Drawing Sheets

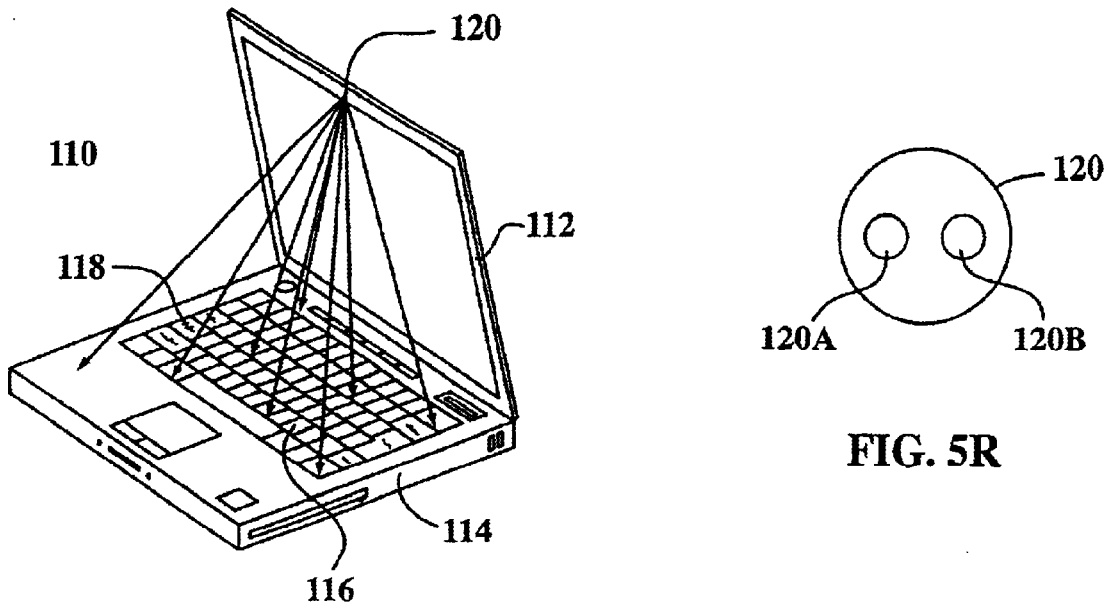
FIG. 5P
FIG. 5R
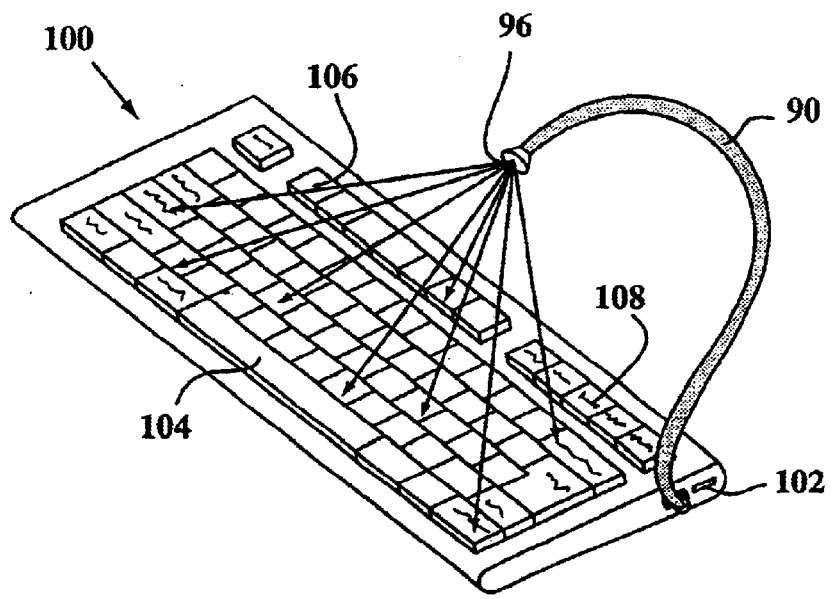
FIG. 5O

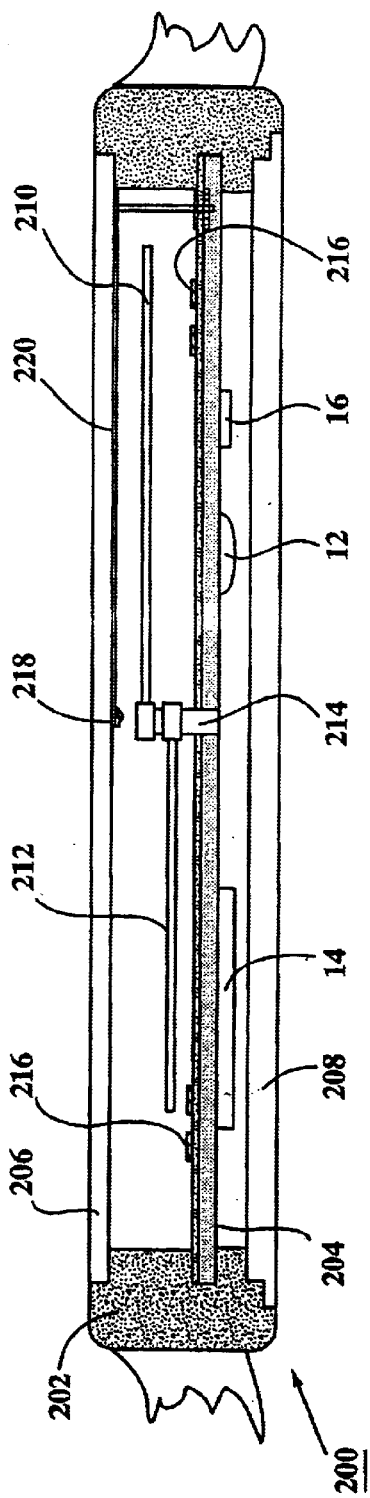
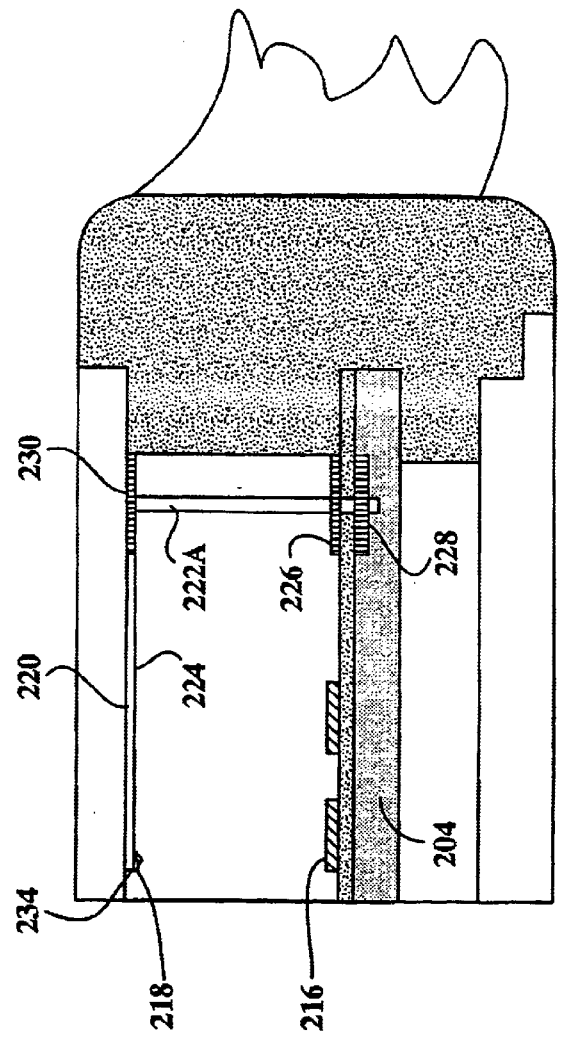
FIG. 9A
FIG. 9B

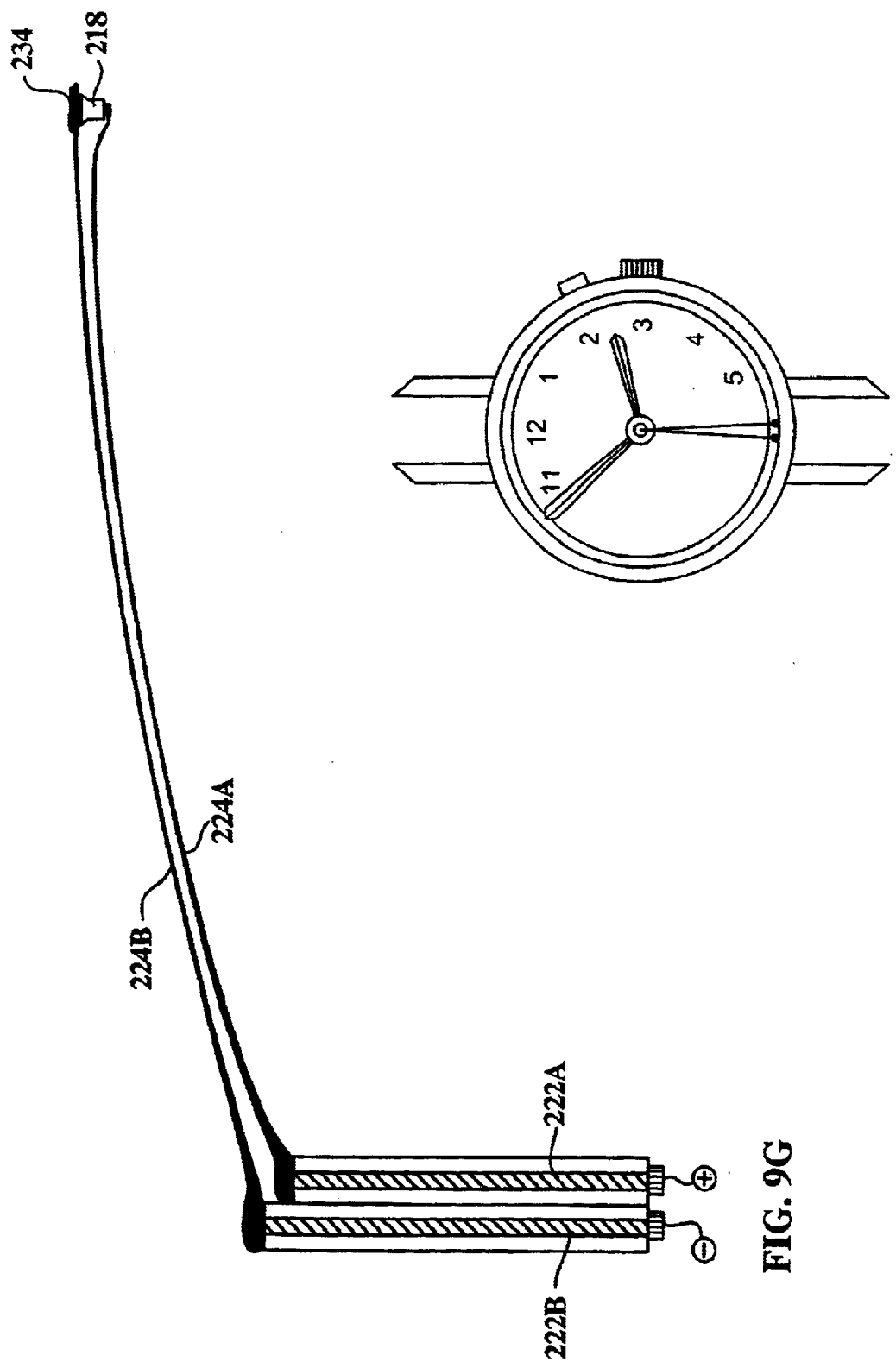

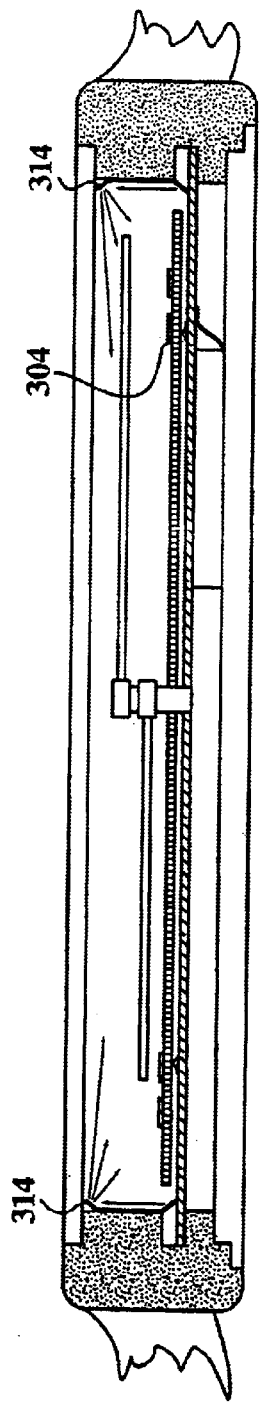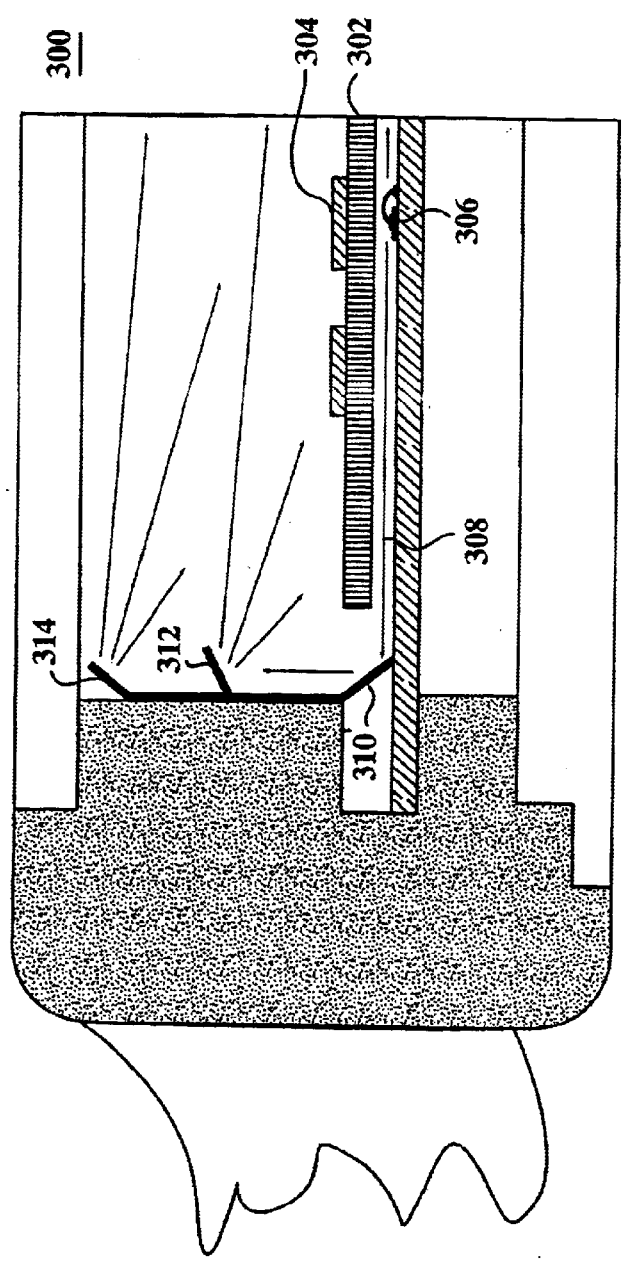
FIG. 13A
FIG. 13B

ILLUMINATION DEVICES FOR WATCHES AND OTHER INSTRUMENTS

RELATED APPLICATIONS

This application claims priority to provisional applications Ser. No. 60/288,330 filed May 3, 2001; Ser. No. 60/298,984 filed Jun. 18, 2001; and Ser. No. 60/315,323 filed Aug. 28, 2001; all incorporated herein by reference.

The subject matter of this application is also related to application Ser. No. 09/659,189 filed Sep. 12, 2000, entitled SEMICONDUCTOR LIGHT EMITTING ELEMENT FORMED ON A CLEAR OR TRANSLUCENT SUBSTRATE, now, U.S. Pat No. 6,486,561 incorporated herein by reference.

BACKGROUND OF THE INVENTION

A. Field of the Invention

This invention relates generally to an improvement in illumination devices such as electronic timepieces equipped for a conventional analog or digital display, indicator gauges, which may comprises a meter panel, directional gauges, used for example in motor vehicles, ornamentation displays of an image, logo or design, and other similar articles which are illuminated for viewing under poor lighting conditions.

B. Description of the Prior Art

Historically, watches, gauges and other similar articles were first illuminated by using phosphorescent markings. However, when both the manufacturing methods of phosphorescent materials and the materials themselves proved to be medically and environmentally unacceptable, other illuminating means were developed. Some of these other means include the use of LED, LCD, and fluorescent devices, as well as incandescent bulbs. All of these proved to be unsatisfactory, especially for small devices such as wrist watches.

Additionally, these devices could not provide sufficient illumination due to a non-uniformity in brightness across the illuminated display surface. The insufficient illumination was the result of the positioning or shape of the light source itself which was either a point or linear source thereby making these illumination devices limited and unacceptable.

Recently, electroluminescent lighting, hereinafter referred to as EL, was introduced, for an analog or digital watches as another known alternative. An EL element is positioned underneath the watch dials, or other surfaces, or alternatively the dials themselves are made of an EL material, as described in U.S. Pat. Nos. 3,749,977—Sliker, 4,775,964—Alessio & Olsen, 4,208,869—Hanaoka, 5,029,046—Kameda, 5,117,334—Kameda. In all of these references direct illumination is provided upward towards the viewer, restricting any aesthetic aspects such as a full color logo or colored images on the dial. Another disadvantage of EL's is that they require complicated auxiliary circuitry. Moreover, the lighting colors are determined by phosphorus contents of the EL, and are limited commercially to colors such as blue-green, white and yellow.

U.S. Pat. No. 5,997,161 discloses a black light instrument cluster illuminated by standard black light or UV bulbs.

U.S. Pat. Nos. 5,962,971 and 5,813,753 disclose complicated means of generating UV light.

In my U.S. Pat. Nos. 6,106,127 and 6,299,321, incorporated herein by reference, I have described an illumination device for a watch and other instruments consisting of a light emitter disposed on a transparent or translucent surface(like the a watch crystal). The emitter receives power from a battery disposed in the watch case through wires imbedded in, or otherwise attached to the crystal. The emitter is adapted to emit light in a wide angle to illuminate the dial of the watch in an even light distribution pattern. The following concepts comprise various improvements to the basic patented invention of the these patents.

OBJECTIVES AND SUMMARY OF THE INVENTION

It is, accordingly, an objective of the present invention to eliminate the above-mentioned disadvantages encountered in the prior art and provide an improved system through which sufficient illumination can be provided to both indicia of interest as well as logos and other decorative elements.

It is another objective of the present invention to provide an improved illumination device for an electronic or analog timepiece, indicator gauge, directional gauge or ornamental device or other articles eliminating any EL as the illumination source and its associated circuitry.

Another objective of the invention is to provide an improved illumination apparatus for viewing the dial or surface of various objects by positioning an illumination device to direct light in a direction towards the subject to be illuminated which makes viewing easier, more efficient and less stressful to the viewer.

A further objective of this invention is to provide in situations such as limited lighting or at night time, the cosmetic illumination of single or multiple color images, logos or items located on or about the surface of a timepiece, indicator or directional gauges or ornamentation devices.

A further objective is to provide a solid state illumination device that makes use of a source of UV light to provide a novel type of illumination for watches, gauges and other similar articles.

The present invention seeks to attain these objectives by disposing a light-emitting element, on or inside a light transmissive surface of the article to be illuminated. This element is positioned in the center, sides or in a random placement and rendered light emisive or is activated by means of an electronic circuit which is installed within or in proximity of said article. An illumination switch controlled by an external control member is provided on the case of the article for selectively activating the light emitting element.

More particularly, the light source is disposed either on an inner surface of, or is imbedded within the cover or article itself, in such a manner that is virtually invisible to the viewer.

In many instances various objects must be observable in the dark or under low lighting conditions. In instances where it is not possible, or it is inconvenient to provide full illumination, low level lighting is provided to light the observed object either directly, laterally, using edge-effect type lighting or using backlight type illumination (wherein the light source is built into or disposed behind the object to be observed). However, these solutions have been found to be unsatisfactory because they provide mediocre lighting at best. Moreover, in many instances these types of devices are not pleasing esthetically.

For example, most automobiles, motorcycles or aeronautical vehicles use some form of interior and/or instrument illumination for visibility at night or in low visibility conditions. This illumination system is usually based on electroluminescent (EL), incandescent or LED devices which require special controls, power supplies, dimmers and so on.

Another example where improved illumination would be useful are laptop computers. Under poor lighting conditions most laptops (as well as PDAs, cell phones, electronic games and other similar small hand-held devices) have built-in light sources or active screens that are fairly easy to see. However, the keyboards and controls for these devices are provided with little or no illumination and accordingly they are very hard to see.

One effective means of lighting objects comprise so-called black lights. These kind of lights are particularly desirable for providing illumination under low lighting conditions and are especially useful when used in combination with fluorescent inks or objects having fluorescent colors applied on the object being illuminated. However, until now, all black light sources comprised high voltage tubes or incandescent lamps that have been coated with a filter adapted to transmit UV light and block most visible light. Typically these filters do allow a small amount of light to escape from the tube in the violet range so that the light can be seen with the naked eye when turned on.

Similarly, a UV light source can be used for a laptop or standard compute keyboard. This light source could be an accessory or built into the unit. As an accessory the unit could be connected and powered through a USB port and could be fixed or could be provided on a flexible support so as to allow the user to customize the position of the light source. The light source could have an on/off switch, which could allow the user to activate the light source as desired.

As an integrated unit within the keyboard or on the periphery it is the UV light sources positioning which is critical for maximum illumination. Under the most efficient circumstances a single UV-LED light source could be positioned above the illuminated object at a predetermined distance for effective illumination but in manner that insures that it will not interfere with the users vision or periphery. The UV light source could be made to provide a broad radial pattern over the entire area or modified with a directional cone or shield focusing the light to the desired area for illumination.

Inks or other materials responsive to UV light (such as fluorescent and phosphorescent inks etc.) are applied onto or processed into the keyboard, mouse or the desired illuminated area and could be make into shapes, diagrams, logos, images or numerals in multiple colors such as red, green, yellow, orange, blue, purple or pink.

BRIEF DESCRIPTION OF THE DRAWINGS

The invention will be better understood by reference to the following description, taken in connection with the appended drawings, in which like reference numerals indicate like parts, and in which:

FIGS. 9A–I show details of a conductor arrangement used to provide power and support a light emitter constructed in accordance with this invention;

FIGS. 13A and 13B show details of light emitter arranged to illuminate a watch, instrument or other device laterally;

DETAILED DESCRIPTION OF THE INVENTION

A. Internal Power Source

Figure 1:
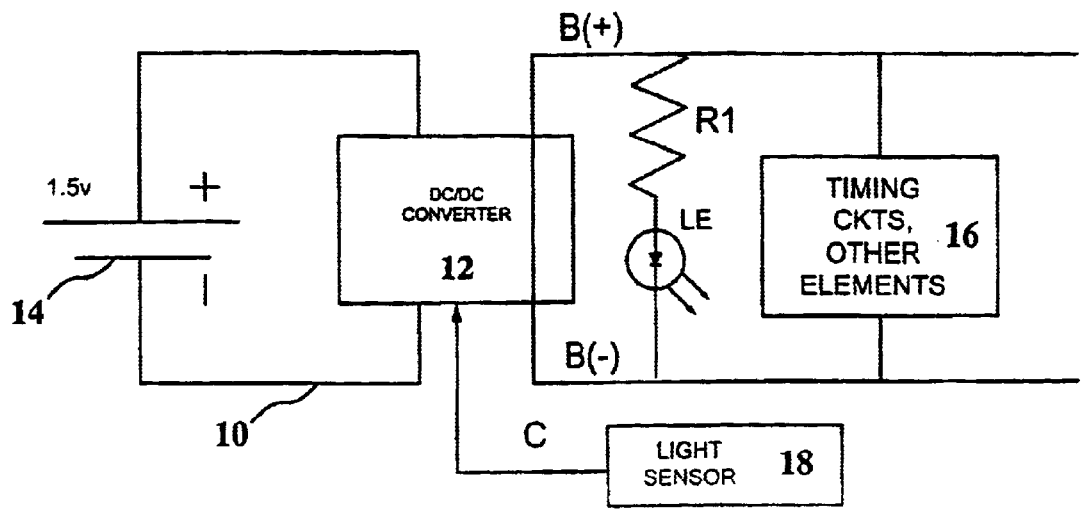
FIG. 1 shows a block diagram of a power circuit for a watch in accordance with this invention.

Typically, watches are powered by a so-called button type battery which is kept small so that it can fit in watches with small cases. This type of battery has a nominal output of about 1.5 volts. Recently, new light emitter devices are marketed which have better light emitting characteristics, including new and brighter colors. For example, light emitting diodes are becoming available which are referred to as Super Bright LEDs using InGaN technology to generate deep blue, standard blue and aquamarine light. Superluminosity light chips are also available which are capable of generating high intensity blue or white light. However, all of these new type of devices require a power source in the range of 2–6 volts and hence could not be used in standard watches having 1.5 volt batteries.

Therefore, according to the present invention, a circuit is provided which converts the power from a standard 1.5 volt battery to a higher level. A circuit 10 of this type is shown in attached FIG. 1. As can be seen in this FIG. 1, the circuit includes a DC/DC converter 12 which powers a 2 to 6 volt bus B—B using power from the 1.5 volt battery 14. DC/DC converters of this type are well known in the art.

An alternate means of providing higher voltage is to use two thin 3 volt lithium batteries known as 1616's in series with a voltage dropping resistor.

Connected to the bus B—B are one or more light emitting elements LE which receive power at the higher voltage from converter and generate light. Preferably a resistor R1 is in series with the LE to limit the current therethrough. Since this bus B—B is available, other elements 16 including timing circuits may be connected to it as well.

The DC/DC converter 12 may be an ASIC which may be preset to generate a preselected voltage on the bus B—B. Alternatively the ASIC could be externally programmable, or could be responsive to a control signal C. In FIG. 1 the control signal C is derived from a light sensor 18. The light sensor 18 is used to sense ambient light. The converter 12 is constructed and arranged to adjust the voltage of the bus B—B in accordance with the control signal C. Accordingly, the voltage on bus B, and hence the intensity of the light produced by the light emitter LE is dependent on the ambient light level.

Alternatively the DC/DC converter could be a dedicated chip or an IC that is incorporated on the PC board of a watch (not shown in FIG. 1) and is set so that it can produce only a single voltage level. This alternative design is less flexible but cheaper to implement.

B. Internal and External Batteries

Some watches have an active element, such as a light source, which uses a substantial amount of energy. In these types of watches, it is customary to use a timer which disables the active element after a predetermined time. For example, a light used to illuminate a watch dial is usually turned off automatically after about 2–3 seconds. However in some instances, it may be desirable to have the active element on for a longer time period. For example, a jogger may want to see his time continuously, or a watch may incorporate a heart rate monitor and the jogger may want to see his heart rate as well.

Figure 2:
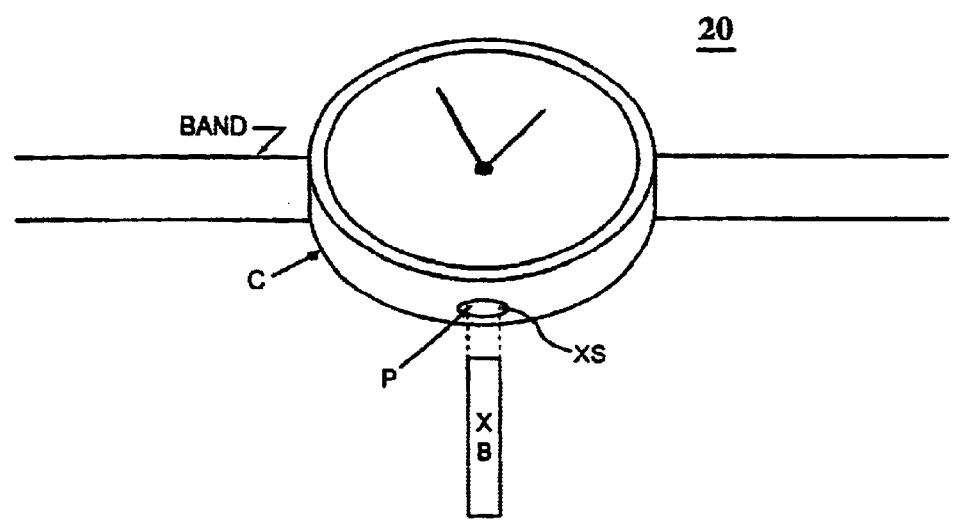
FIG. 2 shows a diagrammatic view of a watch with an external power supply.

For these types of devices, two batteries are provided: an external and an internal battery. Of course, more than one internal and/or more than one external batteries may be provided. As shown in FIG. 2, a watch 20 is shown with a case C and an external battery XB which is connected to the watch case via a plug P.

This external battery can be mounted in a piggyback fashion on the case C, or alternatively it can be mounted on or within the watch band itself, and can be removed therefor and inserted into the plug P as desired. A sensor S that senses the presence of battery XB is associated with plug P.

Figure 3:
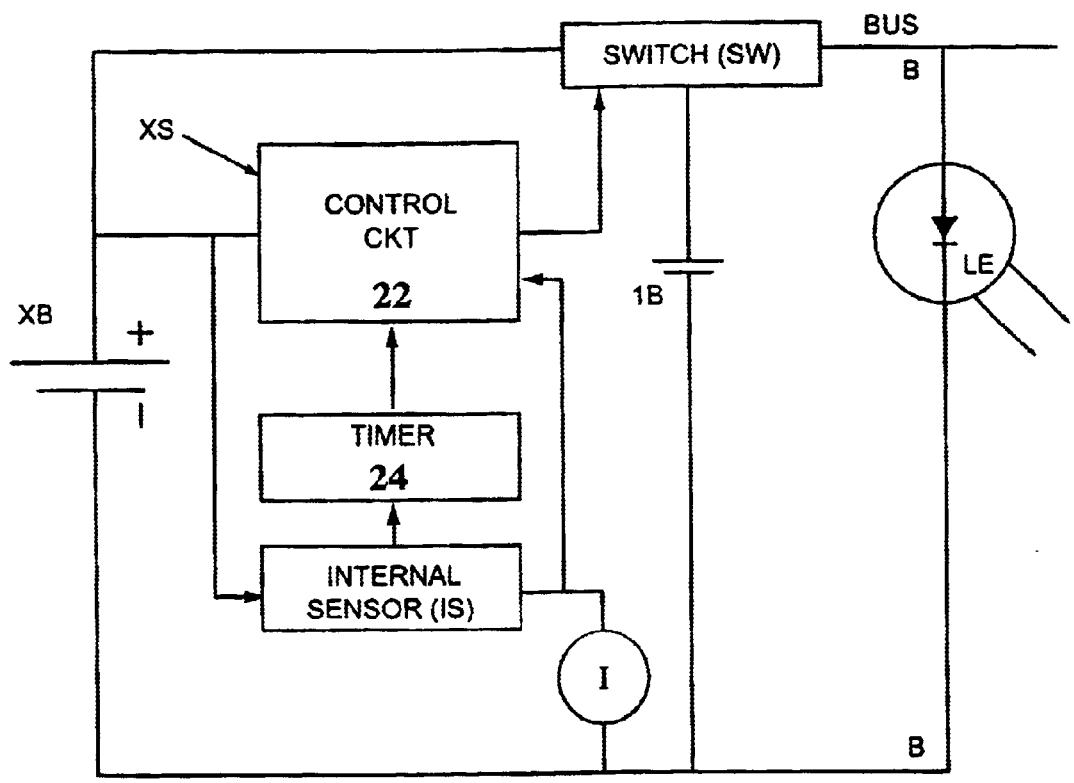
FIG. 3 shows a block diagram of a controller for controlling a light for a watch with an external and an internal battery.

FIG. 3 shows the internal circuitry of watch 20. The circuitry includes two batteries: an internal battery IB and the external battery XB discussed above. The circuitry can operate in a variety of modes as determined by a control circuit 22. In one mode, the two batteries can be connected in parallel to provide power to a bus B—B. In a second mode, a switch SW can be used to selectively connect either the internal or the external battery to the bus. The control circuit 22 can monitor the reserve energy level left in each battery and when one battery gets depleted, the control circuit can automatically switch the bus over from the first to the second battery.

A timer 24 is also associated with the control circuit 22. The timer is used to energize the bus (which may be used, for example, to power a light LE) for a predetermined time period. As discussed above, this time period may dependent on which battery is being used as the energy source for the bus. With the internal battery IB as the power source, a relatively small time period may be set, for example 3 seconds. With the external battery XB as the power source, a much longer time, for example, two hours, may be set. The control circuit can determine if the external battery XB is in place through external sensor ES. Moreover, the timer and/or the control circuit may also be adapted to pulse the LED LE intermittently at a duty cycle of 10% at a frequency 1 KHz. This operation allows the LED to be operated either at a lower current level to extend the life of the device, at a higher apparent intensity or lower temperature. This operation is effective because the LED has sufficient persistence so that even though a very low duty cycle is used, the LED appears to be on all the time.

Since the operation of the watch may be dependent on the external battery XB, it becomes important for the user to know its status. For this purpose an internal sensor maybe used to show determine the reserve energy left in the external battery XB. When the external battery XB becomes discharged, an indication light I is activated to alert the user that the external battery must be replaced (or recharged if possible). Alternatively the indicator light I may be on whenever the external battery is connected to the watch to indicate that the external battery is operational. When the external battery is depleted, the indicator light I can be set to blink by the sensor IS, and/or the control circuit 22.

While the external battery was described as being used to power a watch, obviously it could be plugged into the case of other types of devices such as handheld game, a PDA, a cell phone, etc.

C. Control Switching

Most modern electronic watches include one or more pushbuttons used to activate its various functions. As these devices evolved the number of functions that they could performed continuously increased. However, the number of pushbuttons that could be accommodated on a watch case and the number of operations assigned to each is very limited.

Figure 4:
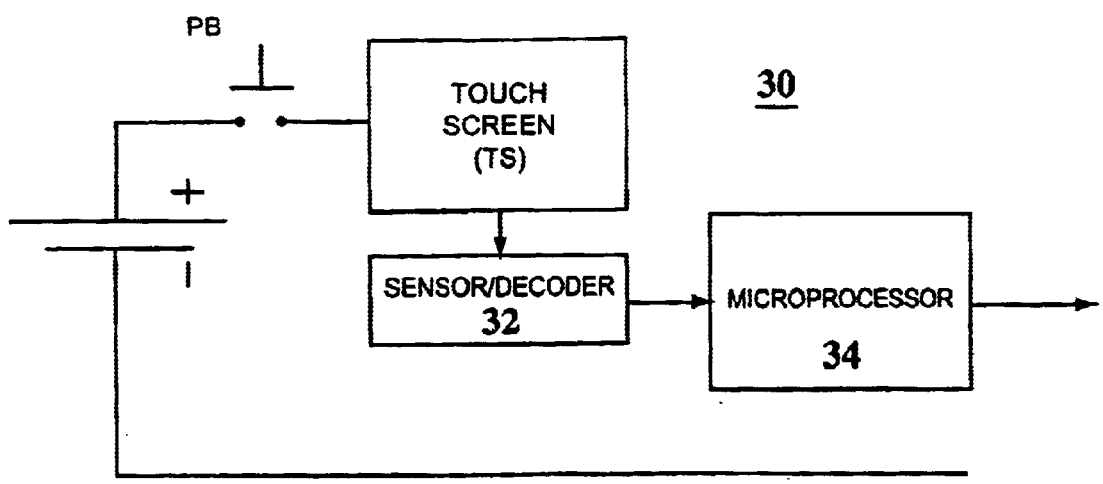
FIG. 4 shows a block diagram of a watch with a touch screen.

As shown in FIG. 4, this problem is resolved by providing the face (not shown) or any other accessible part of a watch 30 with a touch screen TS. The touch screen TS could be a resistive, a capacitive type or any other similar type of device that can be used to detect when a particular portion of the screen TS is touched by a user. Of course, normally, the touch screen TS should not be active because otherwise it would react to any inadvertent touch by the user or the user may press the watch face against other objects. Therefore, in accordance with this invention, the touch screen TS is activated for a predetermined time after a pushbutton PB is pressed. Thereafter a sensor/decoder 34 is used to sense what portion of the screen (if any) is touched, and to generate an appropriate code for a microprocessor 34. The microprocessor 34, which also controls all the functions of watch 30 then performs an appropriate function.

Some functions that may be activated in this manner are:
  a. Controlling the illumination level of the watch face;
  b. Controlling the duration of illumination;
  c. Blinking
  d. Alarm functions Of course, these are just illustrative examples, and many other functions may be performed as well.

The touch screen TS is normally transparent so that it can be disposed on top of, or incorporated into, or positioned on the bottom surface of the crystal.

D. Illumination Using UV Light

One aspect of the present invention pertains to various systems and devices wherein various elements are rendered visible at night, and/or low light conditions by using in combination a solid state UV source such as a UV emitter or UV LED in and alphanumeric characters and/or images printed or otherwise deposited using a UV-sensitive material.

Figure 5:
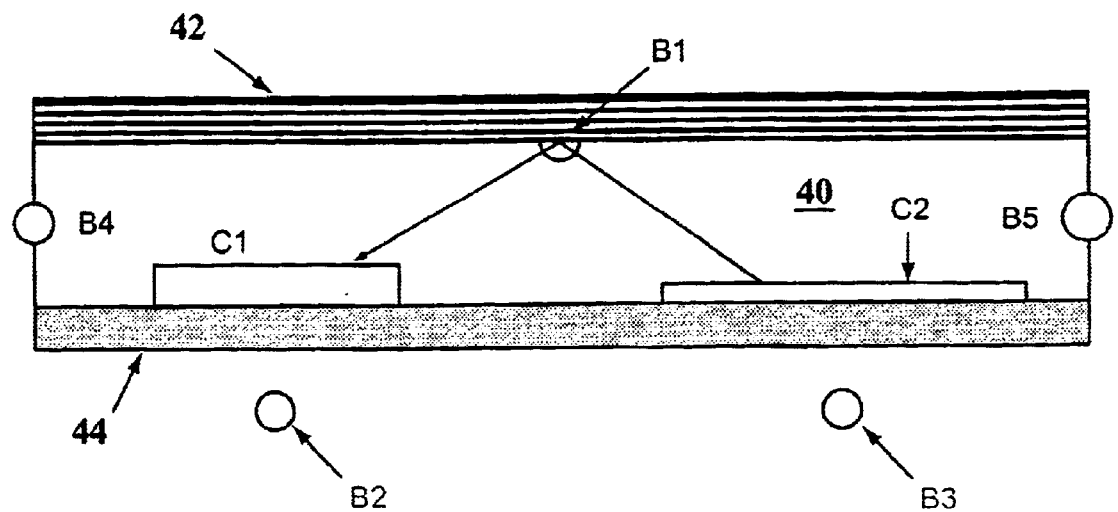
FIG. 5 shows a side sectional view of a watch with several positions of a UV emitter in accordance with this invention.

In accordance with the present invention, as shown in FIG. 5, the dial or a watch 40 or other instrument is illuminated, as shown in FIG. 5 by using a light emitter B1 which is a semiconductive junction adapted to emit UV light. In one embodiment the light emitter B1 is attached and mounted on the bottom surface of a cover, such as a crystal 42 crystal.

Preferably, the dial 44 is provided with one or more images C1, C2 which could be alphanumeric characters or any other types of images. Preferably these characters are printed or otherwise affixed to the dial using a phosphorescent or fluorescent ink. When the UV light from source B1 hits these characters, they appear to glow and are very visible. This type of illumination is especially advantageous under low ambient lighting conditions or in the dark. While in FIG. 5a watch is illustrated, it should be understood that the same principles may be used to illuminate many other types of devices such as gauges, and the like. For example, a gauge on the instrument panel of a car, truck or plane may be lit in this manner, as disclosed in more detail below.

Moreover, while in FIG. 5 the light emitter B1 is shown on the crystal, other light emitters may also be under the dial, such as B2 and B3 or on the sides, such as B4 and B5. With the emitters on the bottom, the dial 44 has to be made of a material that is transparent or translucent at least to UV light.

The emitters B1–B5 etc. could be implemented as a flop chip, a flip chip or other types of ICs. In one embodiment, the emitters are covered with sheath made of glass, plastic or other materials for enhancing the effectiveness of the junction at the desired light wavelengths. The sheath could be very dark, or it could be blue, green or violet. Moreover, if it known that if a phosphorous tip is formed on the sheath then the tip generates a bright white light.

The emitters B1–B5 are connected of course to a power supply which has been omitted for the sake of clarity using conductors described in more detail below.

Importantly, emitters B1–B5 can be LEDs adapted to provide UV light in the range of 315–320 to 380–400 nm (nanometers, usually referred to as UV-A). LEDs of this type are available from Cree in the USA and Nichia in Japan. However, preferably, the emitters are formed from semiconductor junctions without a focusing lens (which are normally provided on conventional LEDs). The present inventor has found that if the focusing lens, is omitted, the emitter generates a wide angle beam which is substantially uniform.

The second component of this aspect of the invention consists of various indicia (such as C1 and C2) made imprinted or otherwise attached to a support and created from fluorescent inks. These indicia can be applied and formed into shapes, images, logos, script or numerals. In motor vehicle or motorcycle, the fluorescent inks could be used to outline instrument clusters such as a speedometer, gearshifter, cup holder or other instruments. If a moving element needs to be illuminated, for example, a speedometer needle, the indicia can be applied to the moving element itself.

The UV source (such as the emitter B1) is preferably positioned above the illuminated object and oriented so that its light impinges on the indicia at a predetermined angle. If a UV generating LED is used as the source it can be placed at various positions within the motor vehicle very easily because it is very small and unobtrusive. The UV lighting source could be positioned in the inside of the roof for the front and back seats or within the instrument cluster, on the underside of the rearview mirror or the center console depending on where UV illumination is desired for exciting the applicable fluorescent ink. This type of illumination is much more informative and cost effective then the currently available lighting devices.

Optionally, in the watch of FIG. 5 the dial 44 can be made transparent and additional indicia may be provided under the dial on various components of the watch(not shown). These components can then become visible when the respective UV emitters, such as B1 are activated. This embodiment is especially attractive if the watch is an analog watch with some moving parts since these moving parts can then become highlighted by the UV light from the sources.

Our application uses one or more UV light sources that can be focused to generate a narrow beam or can be disbursed to form a radial pattern to illuminate multiple objects or elements with a single light source. Advantageously, the fluorescent inks are available in many brilliant colors including combinations such as red, green, blue, pink, purple or yellow. Moreover, the indicia can be formed with different colored inks which are illuminated with a single UV light.

Figure 5A:
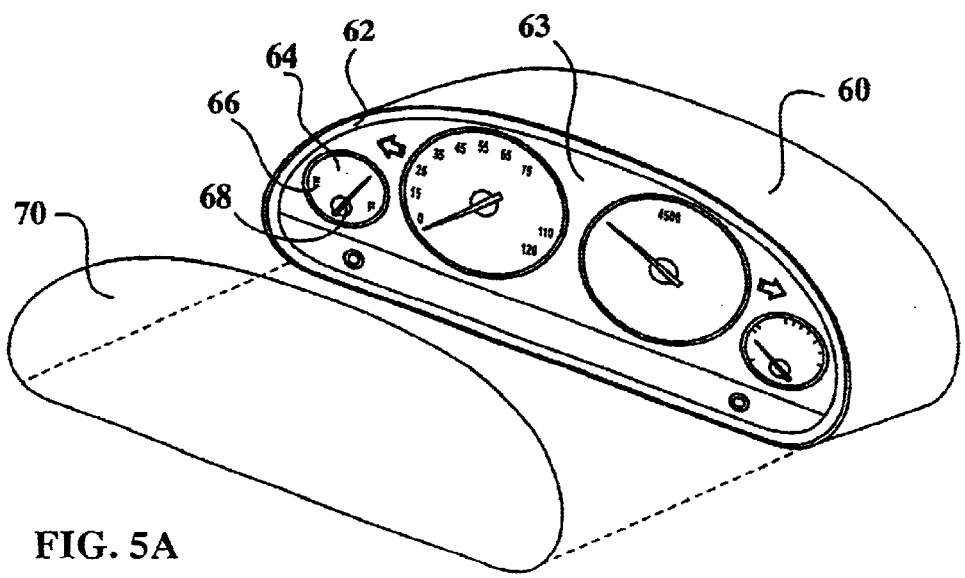
FIGS. 5A–5R show schematically various lighting arrangements of various different apparatus in accordance with this invention.

These concepts are illustrated in more detail in FIGS. 5A–5R. FIG. 5A shows an instrument panel 60 used either on the dashboard of an automobile or other motor vehicle, such as a truck, bus, tractor, airplane, motorcycle, etc. The panel includes a housing 62 and a face 63 on which there are a plurality of instruments 64. These instruments may include a speedometer, a tachometer, a fuel gauge, a pressure gauge, a water temperature gauge, and other various indicia, well known in the art. Each instrument is defined by a plurality of elements. Some of these elements can be fixed, while others can be moving. For example, elements 66 are stationary elements consisting of alphanumeric characters painted or otherwise affixed to the face 63. Element 68 consists of a needle pivoting about an axis (not shown) and having an angular position that indicates a certain parameter associated with the operation of the motor vehicle. Importantly, all or some of these indicia, are printed or incorporate a substance that is flourescent and therefore visible in the daylight as well as well as when illuminated by UV light. Alternatively, each indicia may be composed of one element that is visible by daylight and a second element that is visible under UV light. The indicia may made of inks, phosphors or other similar materials.

The needle comprising element 68 may be painted with the appropriate material either along its entire length. Alternatively the tip of the needle may be covered with the fluorescent ink.

The panel 60 is protected by a transparent cover 70 made of glass, plastic or suitable material.

Figure 5B:
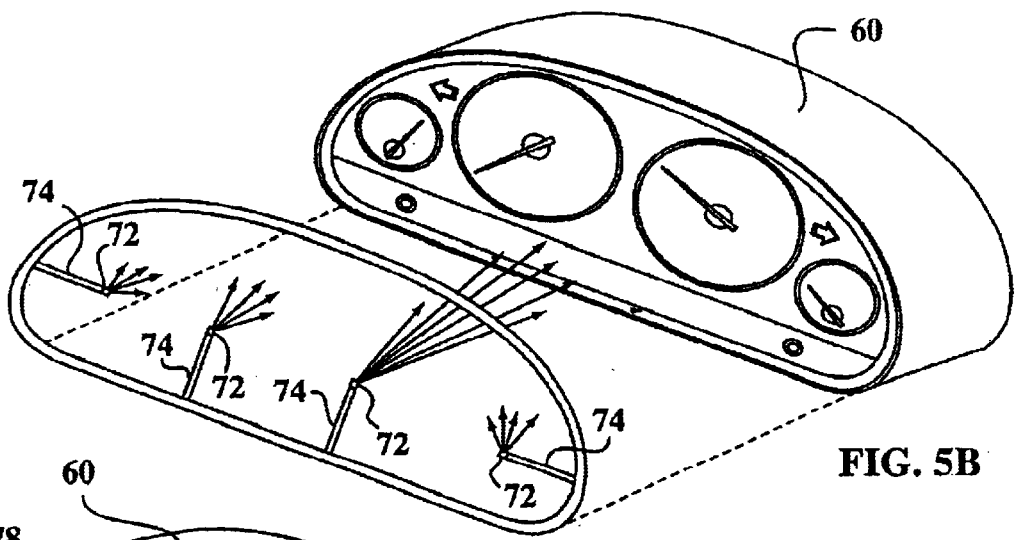

UV light for the indicia is provided by a plurality of light sources that can be provided and positioned in a number of different configurations. For example, in FIG. 5B, a cover 70A is provided with a plurality of sources 72, each source being positioned so that when the cover 70A is in place, each source is positioned above the center of one of the instruments 64. The cover 70A also includes conductors 74 that provide power to the light sources 72. Preferably, the light sources consists of semiconductor emitters as discussed above. Various structures and configurations for the conductors 74 are discussed in more detail below.

Figure 5C:
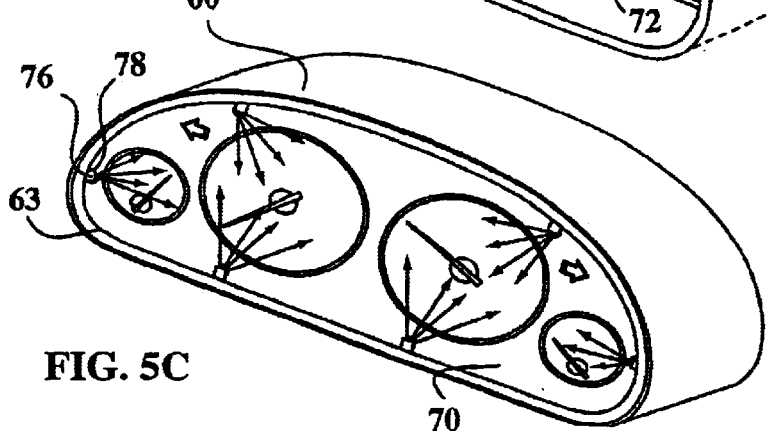

FIG. 5C shows another embodiment of the invention. In this embodiment the housing 60 includes bosses 76 disposed peripherally of each instrument 64. Each instrument may be provided with one or more such bosses 76. Each is mounted on the face (or alternately), on the cover 70 and carries at least one light source 78. Some bosses may be used to support more than one light source. Each light source is arranged and constructed to generate UV light directed toward a respective instrument.

Figure 5D:
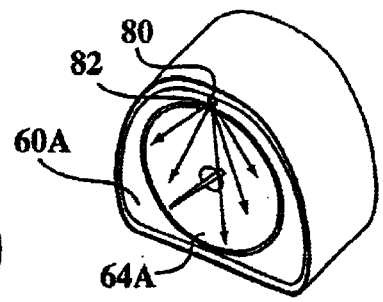

FIG. 5D shows a modified housing 60A that incorporates only a single instrument 64A. The housing 60A includes a boss 80 holding a light source 82 oriented to illuminate the instrument 64A.

Figure 5E:
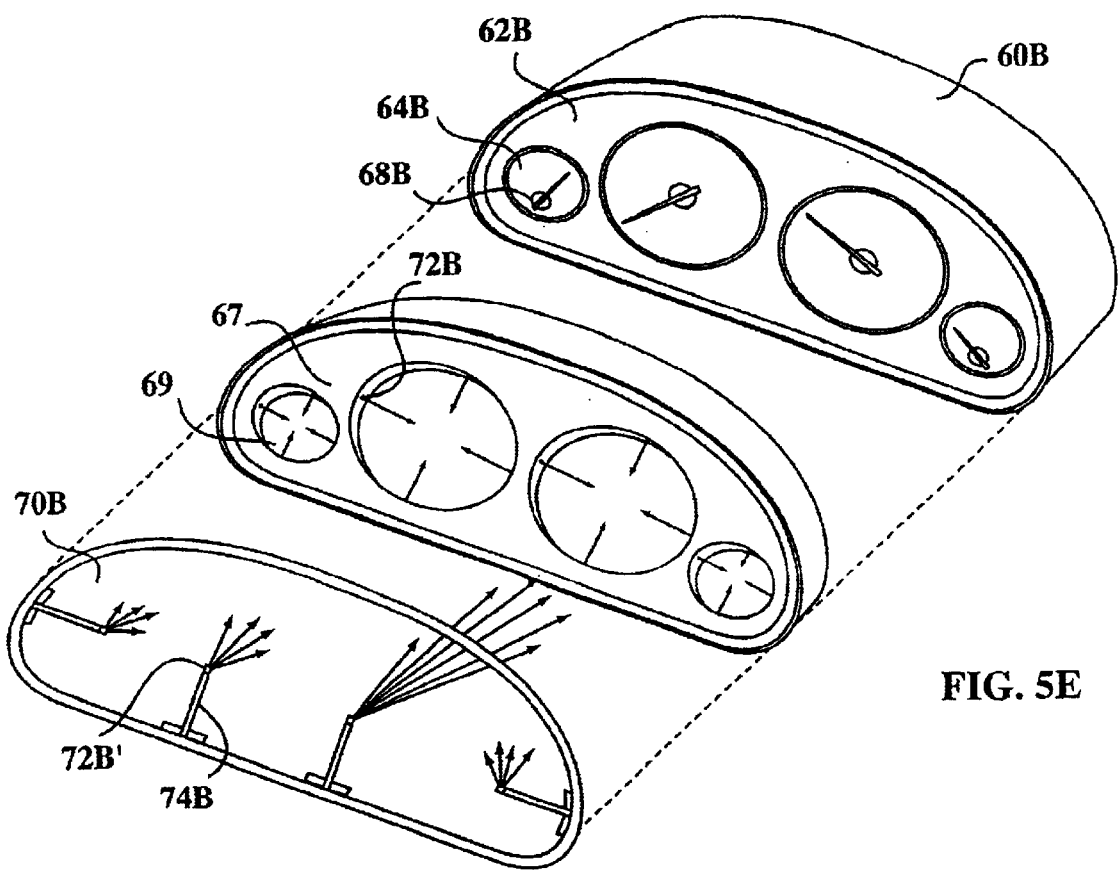

FIG. 5E shows another embodiment. In this embodiment, housing 60B includes a face 62B on which there are a plurality of instruments 64B including pivoting needles 68B. An intermediate plate 67 is fitted over the face 62B. The plate 67 has a plurality of circular cutouts 69. The circular cutouts 69 have sidewalls supporting one or more UV sources 72B. The sources are oriented radially. The intermediate plate fits over the face 62B so that each needle 68B enters into one of the opening 70 and is illuminated by sources 72B. Additionally, cover 70B fits over the intermediate plate. The cover 72B is optionally provided with additional light emitters 72B' positioned like sources 72 in FIG. 5B to further illuminate the instruments. The emitters 72B' are powered by current through conductors 74B.

Figure 5F:
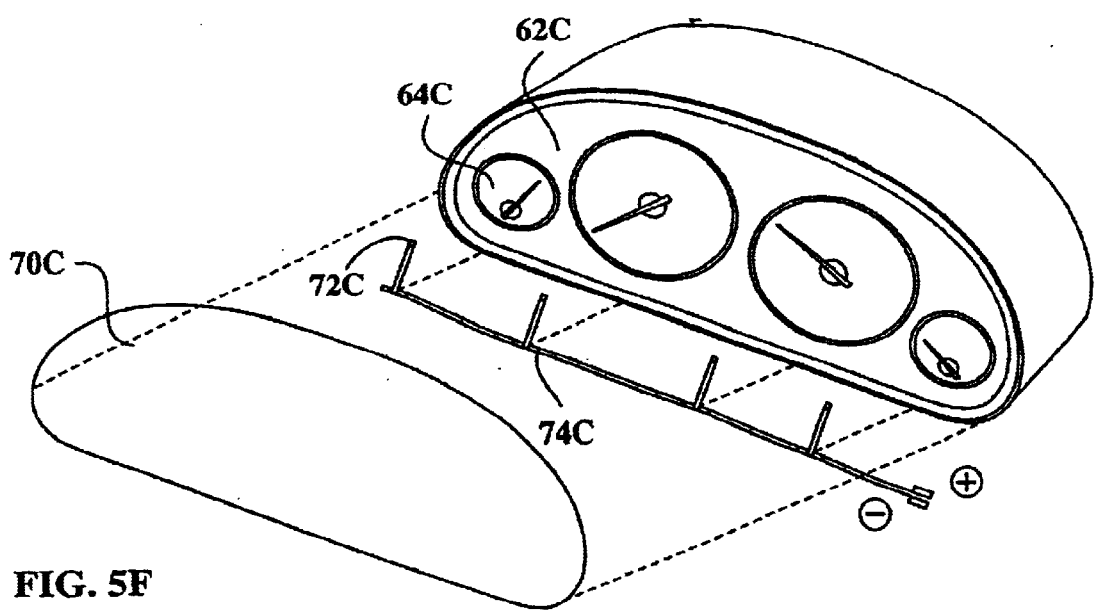

FIG. 5F shows another embodiment with a face 62C, instruments 64C defined by indicia similar to the indicia 66, 68 in FIG. 5A, and a clear cover 70C. An independent, self supporting set of conductors 74C are provided that extends between the face 62C and the cover 70C. The sources 72C are attached to the conductors 74C.

In all the embodiments discussed above each of the individual instruments can be illuminated using a light emitter or source, preferably centrally located. Alternatively, a plurality of emitters are used that are dispersed peripherally around each instrument at various angular positions. Of course a combination of both schemes may be used.

Figure 5G:
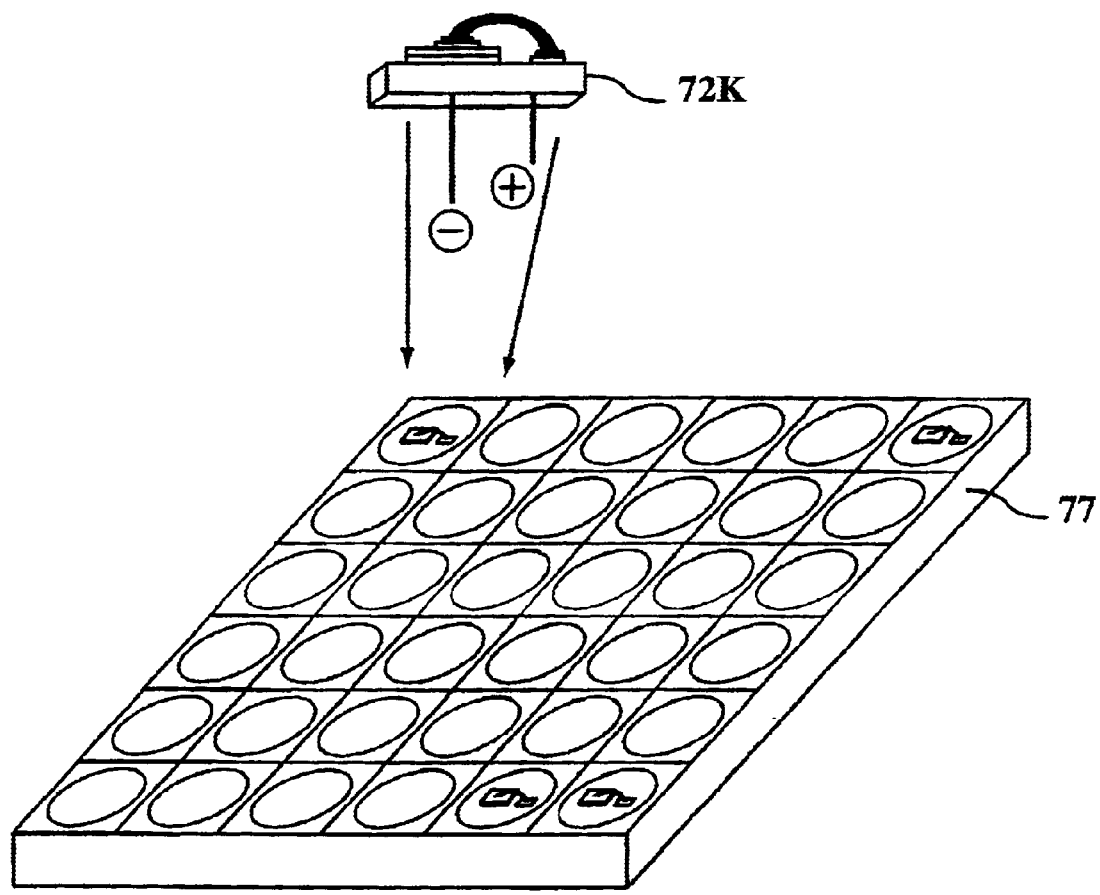
Figure 5H:
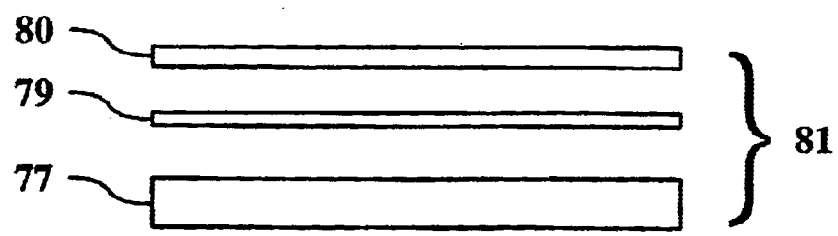

FIG. 5G shows a panel 77 formed into a grid pattern or two dimensional array defined by a plurality of light emitters 72K. This panel can be made into any size, and can be mounted behind a transparent or translucent billboard, or other large sign for illumination as required. FIG. 5H shows the panel 77 used in a display 81. The display includes a sheet 79 covered by a phosphorescent or other UV responsive material. When the emitters 72K are activated, the UV light therefrom impinges and renders sheet 79 luminescent. The sheet then forms a back light for a sheet 80 that is imprinted with an image.

Figure 5I:
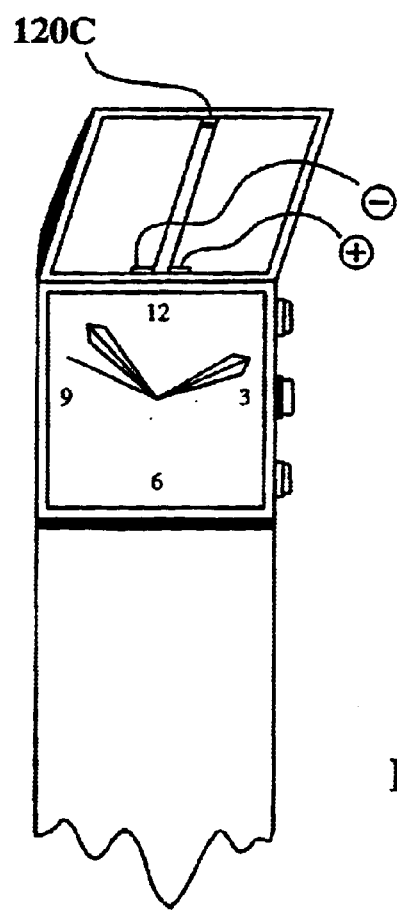

FIG. 5I shows a wristwatch with a cover having a built in light emitter 120C. When the cover is open the light emitter can be activated to illuminate the watch as shown. The illumination could be visible or UV light.

Figure 5J:
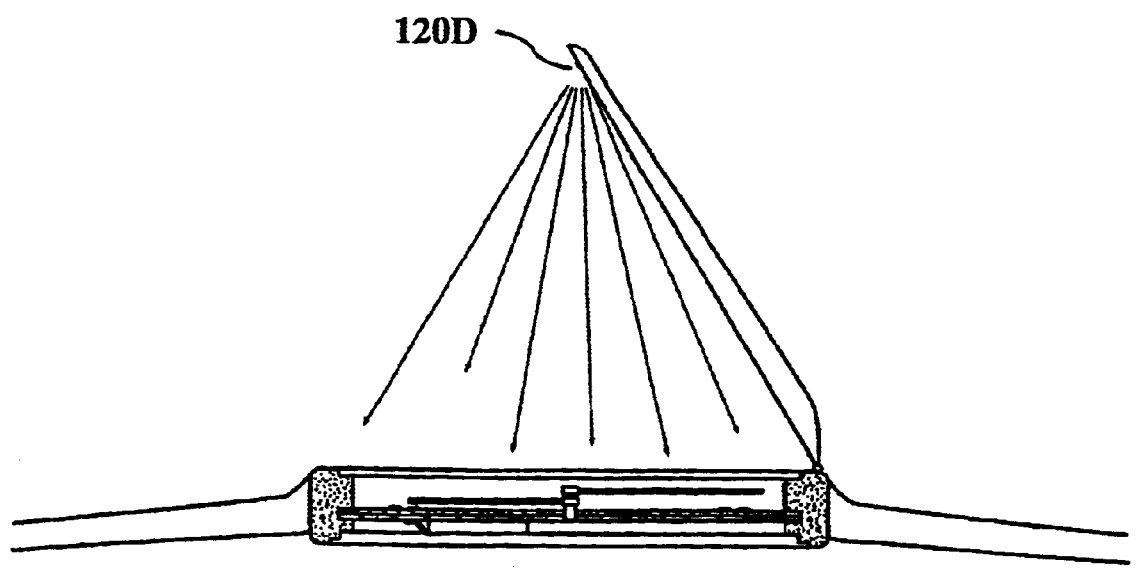

FIG. 5J shows a wrist watch or a pocket watch with a cover having its own light emitter 120D. When the cover is opened, the face of the pocket watch.

Figure 5K:
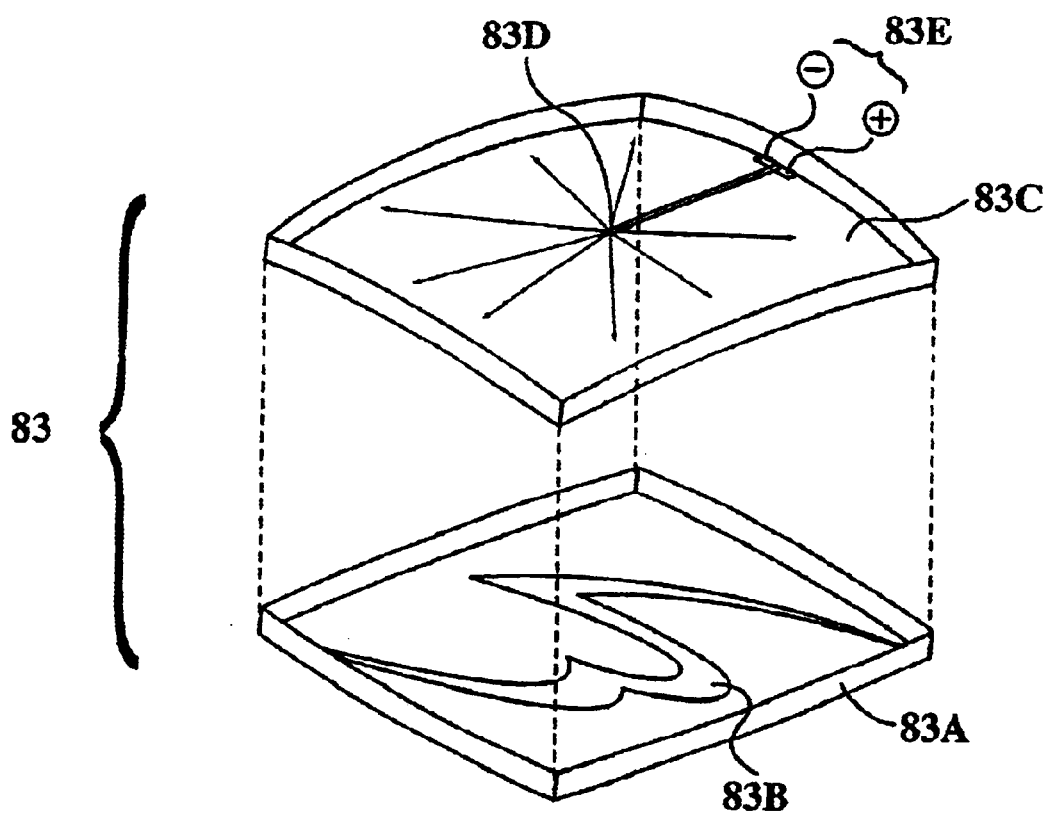

FIG. 5K shows an ornament 83 that can be mounted on a motor vehicle including a car, a motorcycle, etc. The ornament includes a base 83A with a design 83B. A clear protective cover 83C is disposed on top of the base and is domed to provide some interior space therebetween, One or more emitters 83D is attached to the cover and is positioned to selectively illuminate the design 83B. The light emitter 83D is coupled to conductors 83E that are connected to a power source not shown. The power source could be an independent battery, the battery of the car, a power supply, etc. Alternatively, the ornament may also be mounted on a non-motorized apparatus such as a skateboard, a surfboard, and the like, in which case batteries may be incorporated therein.

Figure 5L:
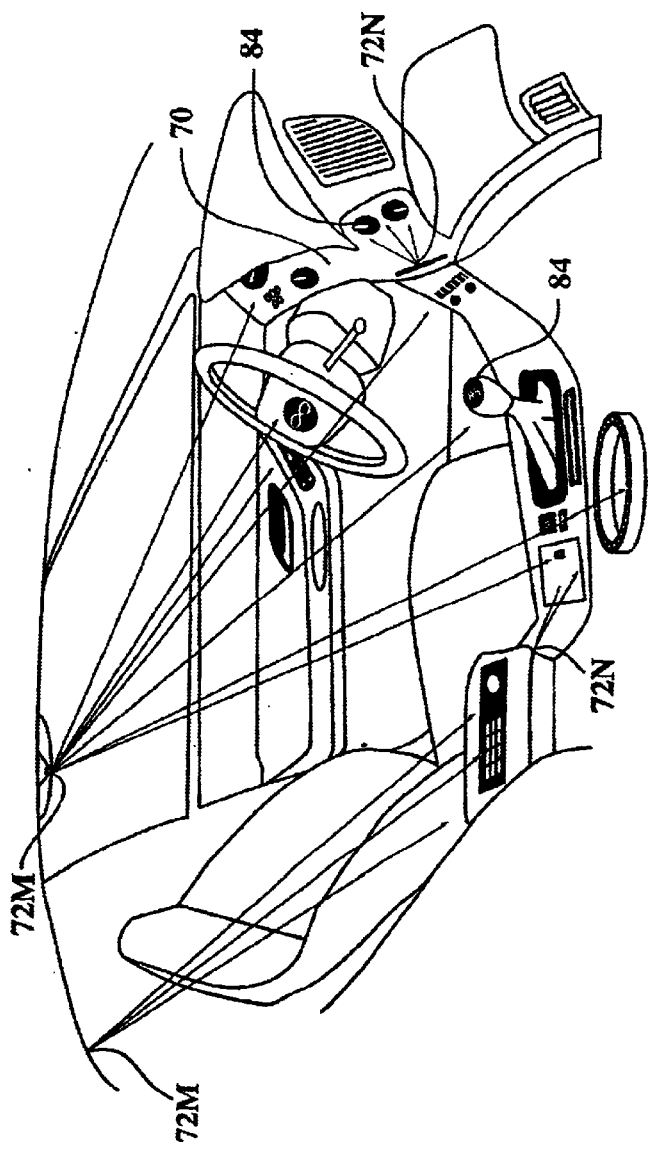
Figure 5M:
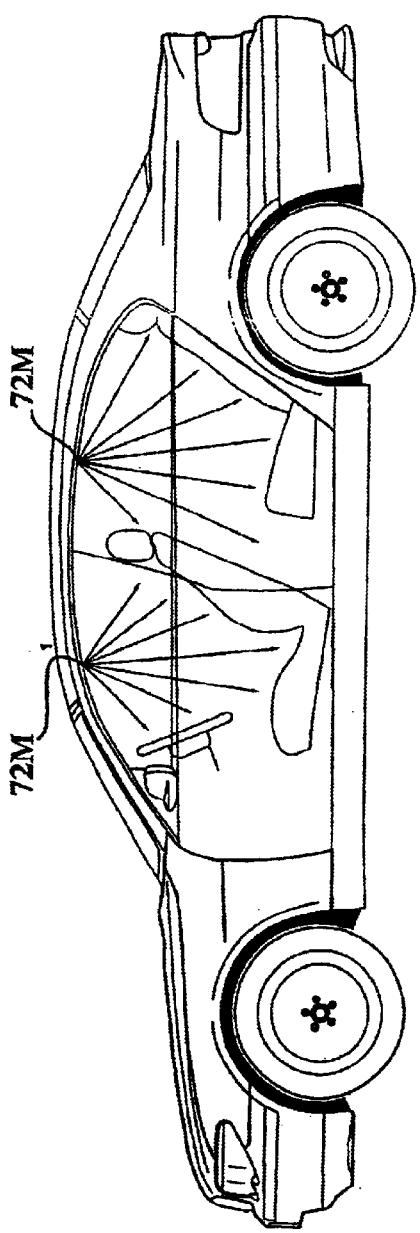
Figure 5N:
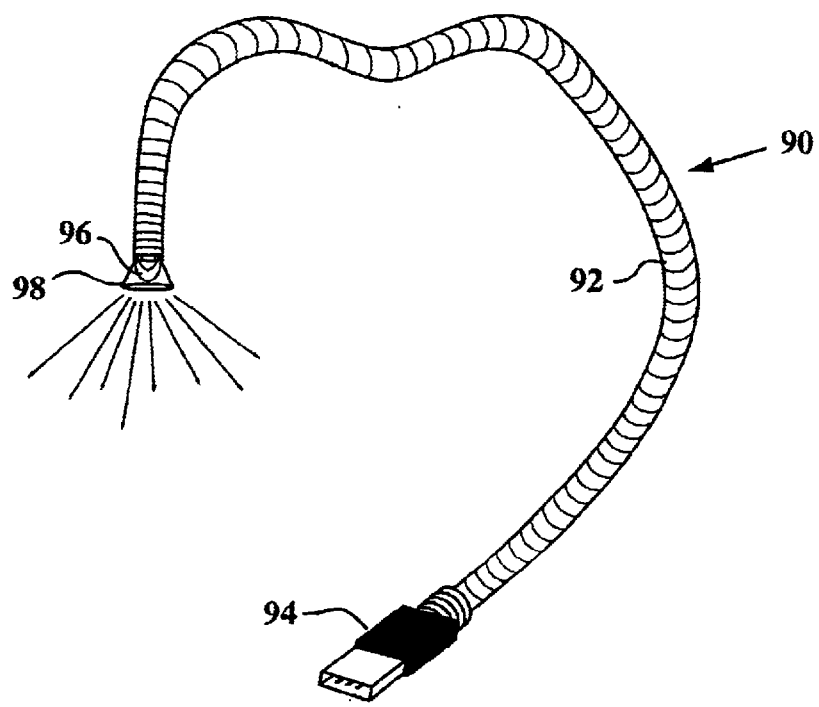
Figure 5Q:
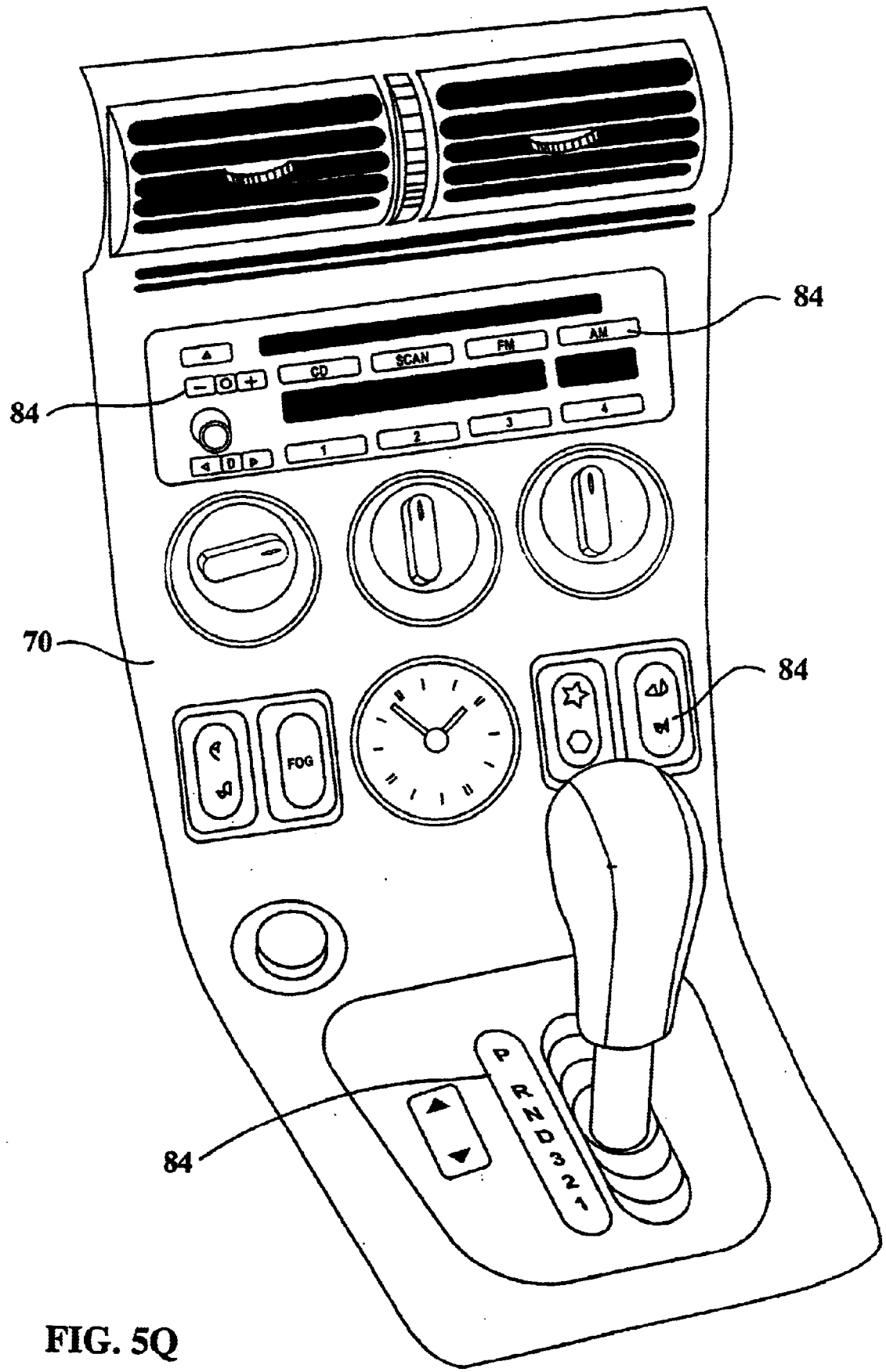

FIGS. 5L, 5M and 5Q show another embodiment of the invention. In this embodiment, in addition to the instrument panel 70, other control elements 84 of a motor vehicle are identified by respective indicia, including the controls for the radio, transmission, air conditioning/heating, radio, seat belts, etc. Each of these indicia are printed or otherwise applied using substances that are visible in the daylight, as well substances that become visible when exposed to UV light. As best seen in FIGS. 5L and 5M, one or more UV emitters 72M are provided on the roof of the automobile. These sources are oriented to illuminate the indicia on these controls. As a result the indicia on all the controls is very easily visible at night, when the rest of the cabin within the motor vehicle must be dark to allow the driver to see his external environment. If necessary additional emitters may be provided, as shown at 72M.

FIGS. 5N and 5O show another embodiment. This embodiment shows a system for illuminating the keyboard of a PC, laptop or other similar devices. The system includes an arm 90 having an elongated body which is made of a semi-rigid material so that it can be bent and shaped into any desired shape. After it has been bent, the arm stays in that position. The body has one end 94 adapted to be mated with or coupled to a housing. In FIG. 5N end 94 is male USB connector adapted to mate with a complementary female connector. Of course the end can be shaped to couple with other types of connections as well. Devices like arm 90 have been proposed previously in which the other end of the arm incorporates an incandescent light bulb. In the present invention, the other end of the body includes a UV source 96, which is preferably a UV emitter as described above. Surrounding the source 96 is a cone-shaped shield 98 that protects the source and may be used to direct the UV light from source 96 in a predetermined direction.

Referring now to FIG. 5O, a standard keyboard 100 is shown. This keyboard can be the keyboard of a lap top, the keyboard for a desk top computer, or other similar device. The keyboard 100 is provided with a USB jack 102. The keyboard further includes with standard QWERTY keys 104 and various other control keys 106. Importantly, each key is identified by an alphanumeric legend 108. According to this invention, this legend is printed using a fluorescent or similar UV-responsive material. Of course the legend should also be visible in daylight.

In operation, the arm 90 is attached to the keyboard through the USB port 102 so that the source 96 is powered through said USB port. If desired, a switch (not shown) may be incorporated into the arm 90 to selectively turn the source 96 on or off. Before, or after the arm is installed, it is shaped so that the source 96 is directed at the keyboard. Once the arm is in position, UV light from the source lights the legend on the keys of the keyboard thereby rendering the same visible. As a result the keyboard is very easy to use in the dark, or under low light conditions. Moreover, the arm 90 works equally well with any other type of device that has a USB, a parallel port, a serial port, a game port or other port that can be used or modified to act as a power source.

FIG. 5P shows another embodiment of the invention. In this Figure, an electronic device 110 is shown. This device could be a laptop, a PDA, a cellphone, a hand-held computer or any other similar device. The device has two articulated portions, a top portion 112 and a bottom portion 114, said two portions being hingedly connected. If the device 110 is a laptop computer, the top portion generally includes a screen (not shown) while the bottom portion includes a keyboard 116 with a legend 118 associated with each key. For other types of devices, the top portion 112 could be a cover and the bottom portion could include a screen. The top portion includes, preferably along one edge, a light source 120, which is, preferably, a UV source. As in the previous embodiment, the legends are printed using a UV-responsive material. The device 110 may also include a switch (not shown) for selective activation of the source. As can be seen in FIG. 5P, the source is positioned, so that when the two portions are separated to form an angle of about 30–135 degrees, the UV source on the first portion illuminates the keyboard or any other legends on the second portion thereby rendering the legends visible in the dark, or low light conditions. In some instances, it may be helpful to mount the source 120 on portion 112 on a pivoting member, so that the source could be directed manually at the legends. Moreover, the UV source could be made adjustable so that it generates broad beam covering the whole keyboard or area of interest, or only a narrow beam covering only a portion of the keyboard.

For the embodiments of FIGS. 5N, 5O and 5P the UV source could be a single UV emitter as described in more detail. Alternatively, the UV source could include two separate UV emitter disposed side by side, as shown in FIG. 5R. In this Figure, emitter 120A is a red-phosphor tipped emitter and UV emitter 120B is an emitter radiating in the invisible spectrum. The two emitters can be activated individually. The emitter 120A renders only certain of the keys visible, for example, the keys that are colored red. This type of operation is advantageous because it is very easy on the eye and allows a user to look quickly at the keyboard and at the screen. Emitters of other colors may be used as well, such as, green or yellow. The UV emitter 120B can be used in a passive mode, for instance when the user watches a DVD movie.

E. Dielectric Coatings

Figure 6:
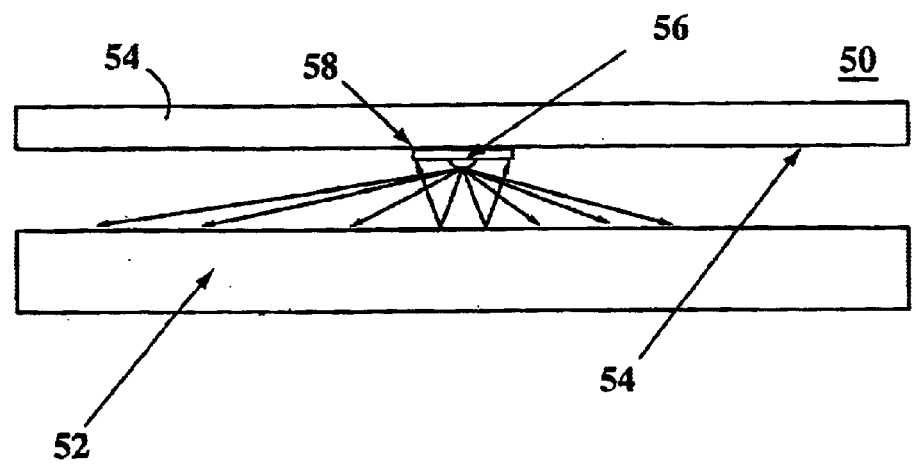
FIG. 6 shows a cross sectional view of a watch with a light emitter and a dielectric coating on the crystal.

FIG. 6 shows another improvement to my invention. In this Figure, a watch or other gauge 50 is shown with a dial 52 and a crystal or other transparent or translucent cover 54. Associated or coupled to the cover is a light source 56, which is preferably an emitter that emits light in the visible spectrum, or an ultraviolet emitter. The emitter 56 is directed toward the dial 52 as described in my U.S. Pat. Nos. 6,106,127 and 6,299,321. However, in addition, a coating or layer 58 is applied to the crystal to form a predetermined image, for example of a logo. Preferably the coating or layer 58 is made of a dielectric material that acts as an insulator. This material is used to form a transparent or translucent design (such as a logo) on the crystal. Dielectric materials that are particularly useful for this purpose are available from 3M. These kinds of materials are particularly useful because they have very unusual optical characteristics. One such characteristic is that they reflect light of one color while transmitting a different color to the dial. The combination of these characteristics can be used to obtain esthetic designs on the watch or other articles being illuminated. Preferably, as shown in FIG. 6, the dielectric coating 58 is applied on the crystal with the emitter 56 resting on the dielectric coating 58. As a result, as seen in FIG. 6 a small amount of light from the emitter 56 is reflected from the dial 52 in such a manner so as to illuminate the coating thereby rendering the respective image clearly visible.

Alternatively the dielectric coating 54 could be made opaque thereby blocking any light from being transmitted in the vicinity of the light emitter thereby masking the light emitter 56 so that it is completely invisible.

F. A UV Flashlight

It is known that UV light can be used to detect certain substances, and accordingly there is a great need for a, portable, effective and convenient light source. For example, a UV light can be used to find and identify various human-related fluids, including blood, urine, semen, etc. A UV source could be used to harden some materials, e.g. fillings and materials used in dentistry UV light could be also used in various security related environments by providing markings and other identifying indicia which is not visible under normal light. Such indicia may be applied, for example, on banknotes, securities, rare, secret or valuable documents, art works, etc.

UV light could also be used in various industrial environments. For example, fluids in an engine could treated with a fluorescent additive and the engine could be inspected with a UV source for cracks or leakages at joints.

Figure 7A:
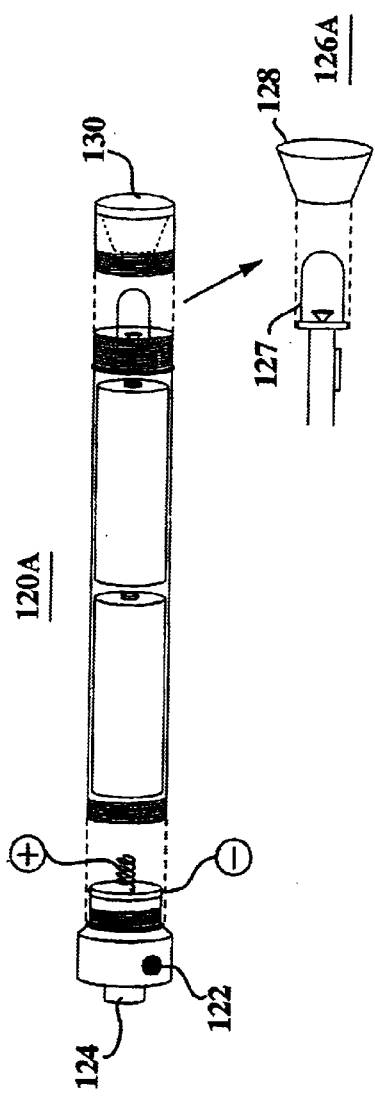
FIGS. 7A–7J show details of a UV flashlight constructed in accordance with this invention.
Figure 7B:
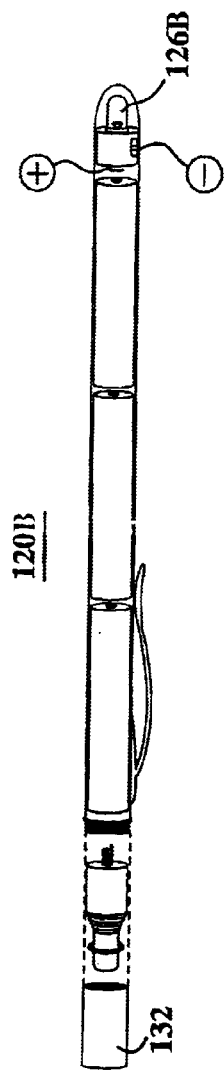

Accordingly, one aspect of the present invention pertains to a flash light. Referring to FIG. 7A, shows a flash light 120 having a standard body with batteries, a keychain hole 122 and a momentary switch 124 at one end. At the other end, there is provided a semiconductor UV source 126, including an emitter 128, and a conical or parabolic shield 128. The source 126 is protected by a transparent protective lid 130. FIG. 7B shows another known type of flashlight 120A. This flashlight has at one end 132 a twist-type an/off switch and a UV source 126A at the other. The housing of FIGS. 7A, 7B is made of a material (aluminum, plastic, etc.) that is relatively rigid.

Figure 7C:
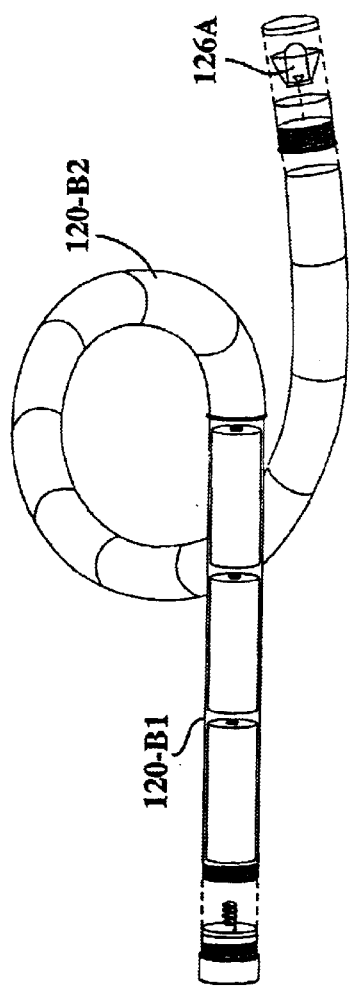

FIG. 7C shows another type of flashlight 120C. This flashlight has a first body portion 120-B1 which is relatively rigid and holds the batteries. A forward portion 120B2 is flexible to allow the positioning of the source 126C into any desired configuration.

Figure 7D:
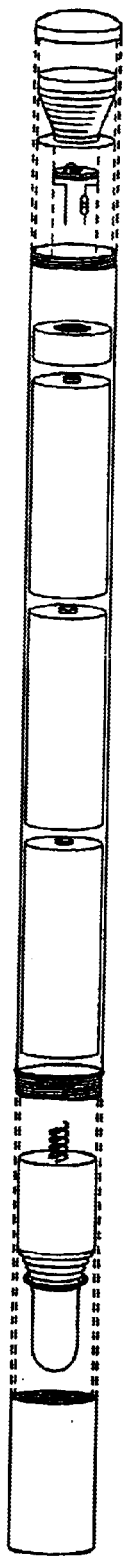

FIG. 7D shows another type flashlight 120D. In this embodiment, instead of plastic or glass, the flashlight is provided with a cover 130 made of quartz. This type of cover is desirable because quartz is transparent to and does not degrade in the presence of UV light.

Figure 7E:
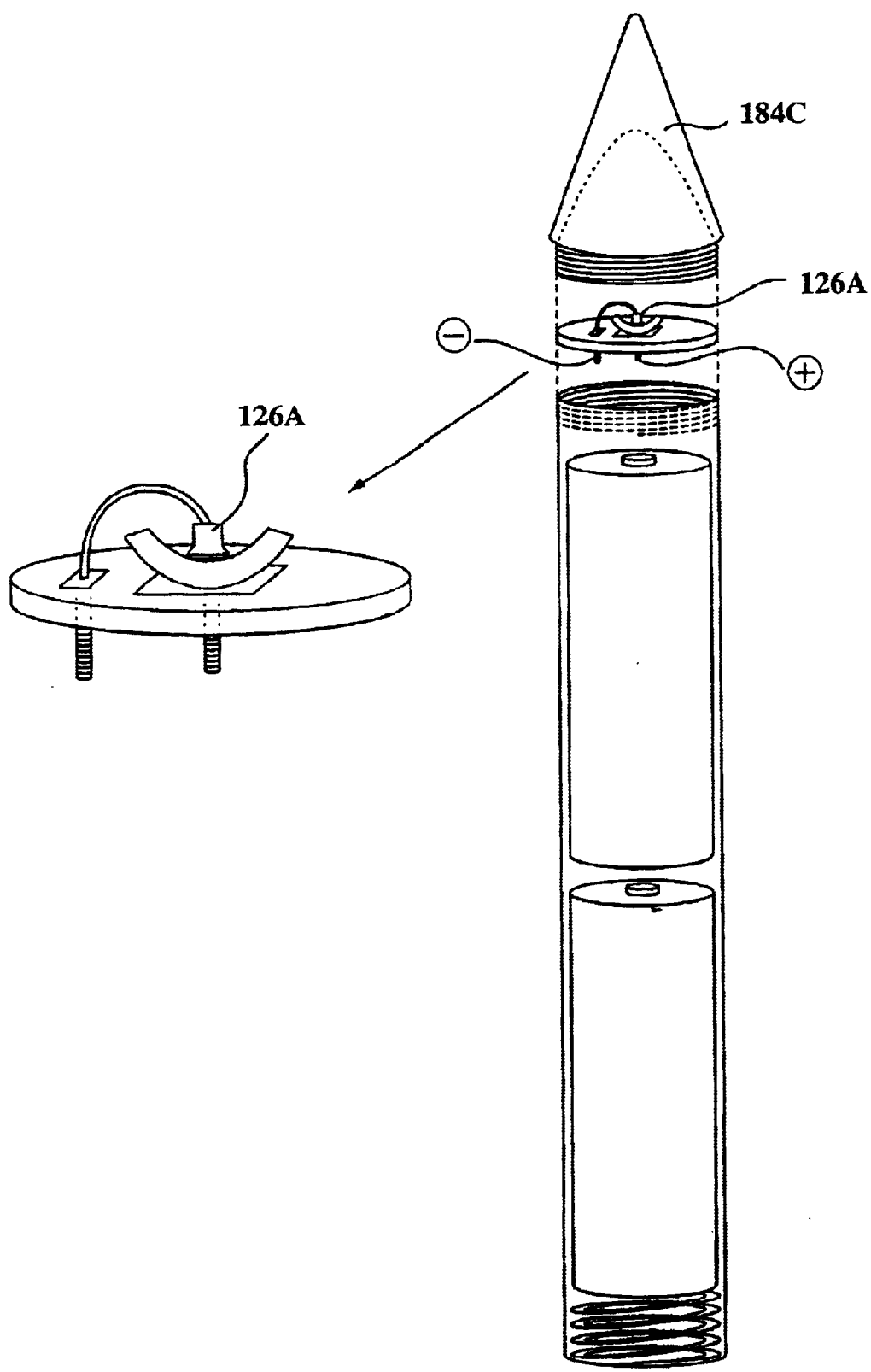
Figure 7F:
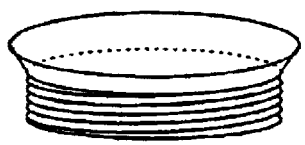
Figure 7G:
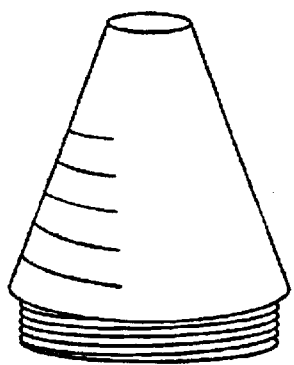
Figure 7H:
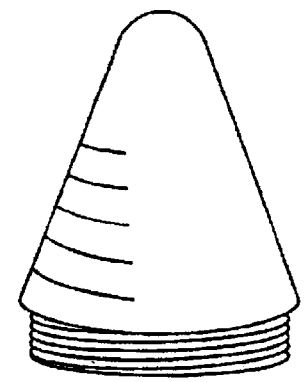
Figure 7I:
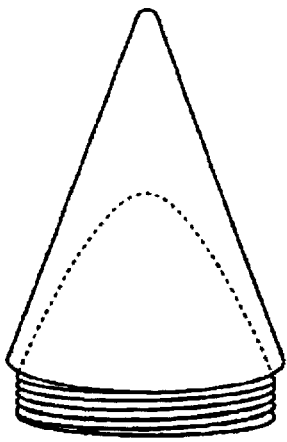
Figure 7J:
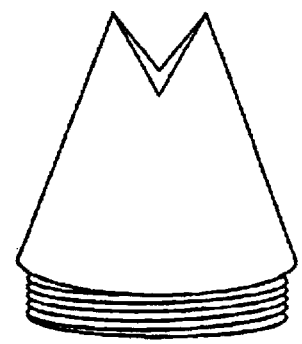

FIG. 7E shows a cross-sectional view of a flashlight particularly useful for the medical applications, including the use of UV for hardening materials. In this embodiment, the reflective cone 184C has a tip that provides a means of attaching one of several different types of cones. The replaceable cones for generating UV beams having different geometric shapes and sizes. In FIG. 7F, a planar lens is shown that generates a generally columnar beam. FIG. 7G shows a truncated cone. FIG. 7H shows a cone with a rounded tip. FIG. 7I shows a cone with a pointed tip. FIG. 7J shows a cone with an inverted tip, e.g. a tip with a V-shaped notch. All these cones have a base that is threaded or provided with other means of attachment for the flashlight and can provide light beams of different shape, intensity and distribution patent.

Figure 8A:
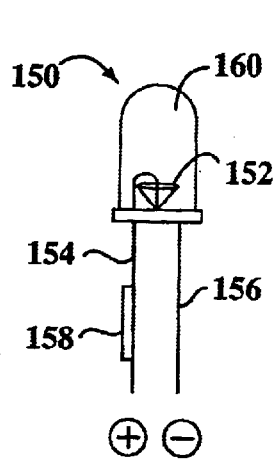
FIGS. 8A–8D show details of the UV source for the flashlight of FIG. 7 and other such devices

For all the applications described above, a UV source is required. As discussed above, a solid state UV source is preferable adapted to emit radiation at about 320–400 nm. A UV LED that may be used is shown in FIG. 8A. In this Figure, the LED 150 includes a semiconductor chip 152 connected to respective terminals 154, 156. One terminal 154 includes, or is connected to a standard current limiting resistor 158. The chip 152 is imbedded in blob of plastic material 160 shaped to protect the junction and to form a light concentrating and focusing lens in the normal fashion.

Figure 8B:
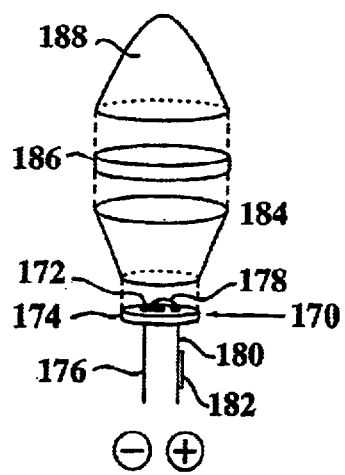

Preferably, however, instead of UV LED with a focusing lens, a UV emitter 170 should be used. The emitter 170 does not have the focusing lens. As illustrated in FIG. 8B, preferably the UV emitter 170 includes a semiconductor chip 172 formed on substrate 174. The chip 172 could be a standard IC chip or a flip chip. One terminal of the chip is bonded to the substrate 174 and then connected to a conductor 176. The other terminal of the IC is connected by a wire bond 178 to the substrate 174. On the substrate the wire bond 178 is connected to a terminal 180. Optionally, a resistor 182 is attached to the terminal 178 as shown and provides current limiting.

Figure 8C:
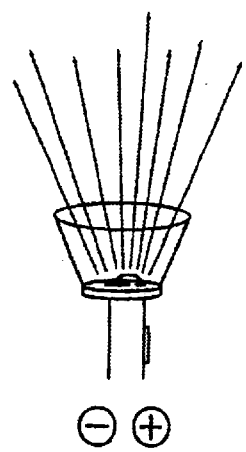

The emitter 170 described so far can be attached to a carrier and used as is to provide a constant and uniform illumination just as is. Optionally, for a more directed light beam, a reflective cone 184 may be placed on the substrate to surround the IC 172. FIG. 8C shows the resulting arrangement.

Finally, a protective cover can be attached to the cone, which can be either disc-shaped, as at 186, or cone shaped, as at 188. The whole emitter 170 can then be sealed and the interior of the cone can be partially evacuated to form a vacuum.

Figure 8D:
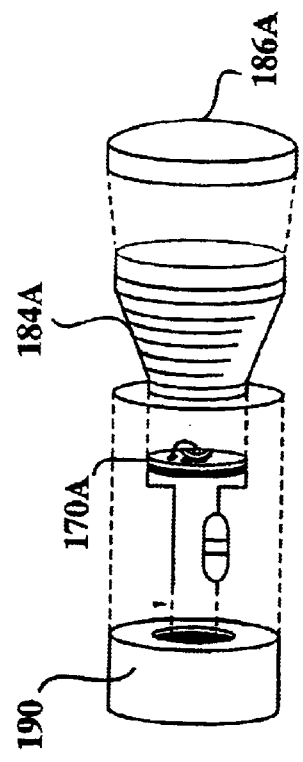

FIG. 8D shows an alternate embodiment of the UV emitter of FIGS. 8A–C. In this embodiment, the emitter 170A is mounted on a plastic holder 190. A conical (or parabolic) shield 186A is mounted around the emitter 170A and a protective quartz lens 186A is added as a cover. Importantly the resulting emitter assembly is sized and shaped to fit unto the flashlight as illustrated in FIG. 7D.

The emitter 170 described so far can be attached to a carrier and used as is to provide a constant and uniform illumination just as is. Optionally, for a more directed light beam, a reflective cone 184 may be placed on the substrate to surround the IC 172. Finally, a protective cover can be attached to the cone, which can be either disc-shaped, as at 186, or cone shaped, as at 188. The whole emitter 170 can then be sealed and the interior of the cone can be partially evacuated to form a vacuum.

G. Conductor Arrangements for Emitters

In many, if not all, of the lighting arrangements discussed above a light emitter is shown which is supported by, or in close proximity to a flat surface. This flat surface is usually a transparent or translucent member, such as, for example, the crystal of a watch. In my co-pending application Ser. No. 09/659,189 filed Sep. 12, 2000, I disclose a method of providing conductors for light emitters in the forms of thin metallic strips deposited on the flat surface. In the following discussion other conductor arrangements are disclosed.

FIG. 9A shows a cross-sectional view of a watch 200 with various elements discussed above. The watch has a case 202, a dial 204, a crystal 206 and a bottom cover 208 sealing the case in the usual manner. Mounted on the dial is a battery 14, a DC/DC converter 12, an ASIC chip 16 with various timing circuits and other control elements. A movement (not shown) is used to drive the hands 210, 212. The hands are supported by a dual shaft 214 in the usual manner.

A plurality of indicia are printed or otherwise attached or formed on the dial 204. These indicia are used to indicate time and other information. The indicia may also include logos. The indicia are visible under normal lighting conditions. In addition, as discussed above, the indicia may also include elements that render them responsive to UV light.

The watch 200 is also provided with a light emitter 218 that provides illumination during low light conditions. The emitter 218 may generate light in the visible range as described in my patents identified above, or it may generate UV light as discussed above. A conductor arrangement 220 is provided to supply energy to the light emitter 218 and to support the same at its desired location.

Details of the conductor arrangement 220 are shown in FIGS. 9B–9F. The conductor arrangement includes a pair of generally vertical pins 222A, 222B and a generally horizontal arm 224. The vertical pins have a circular or square cross section. At their bottom, each pin has a stop 226. Below this stop, the pins extend through the dial 204 and mate with a respective female connector 228. Instead of connectors, a pins could also be mated directly with a PC circuit board to connect the pins to power through a switch (not shown in these drawings). The stops 226 and connectors 228 cooperate to mount the pins vertically on the dial and maintain it in a substantially vertical orientation. The two pins may be made of steel or other material have high tensile strength and may be gold- or copper-plated to eliminate oxidation and to provide low conductivity. The two pins may be connected by crossbars 230 to enhance their structural stability.

The top of the pins 222A, 222B is terminated with a pad 232. This pad can be made of an insulated material with a conductive surface touching the pins. The bar 224 could be made as a solid strip with two conductors imbedded therein, each conductor being connected to one of the pins. Alternatively, the arm 224 may consist of two conductors 224A, 224B made of phosphor bronze which is very good conductor that is also very spring-like flexibility. Thus, the arm 224 is very flexible so that the whole conductor arrangement flexible and easy to install. The lengths of the pins are selected to position pad 232 and arm 224 just underneath the crystal. Since the crustal is non-conductive, the pad 232 or the arm 224 could be touching the crystal without any effect on the operation of the light emitter 218. The ends of the conductors 224A, 224B are attached to respective terminals on the emitter 218 as discussed in more detail below. If the arm 224 is rigid than it may not be necessary to affix the light emitter 218 to the crystal. Thus the crystal is support in a cantilevered manner by the arm 224. However, in order to insure that the light emitter is positioned properly and does not move out of place over time, especially as the watch is shaken during normal ware, the light emitter can be attached to the crystal using an adhesive such as UV curable adhesive 234. FIG. 9J shows the conductors 224A and 224B being angled with respect to each other.

Figure 9E:
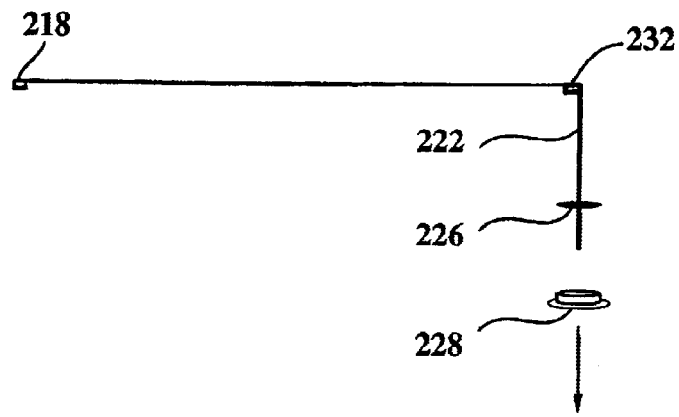
Figure 9D:
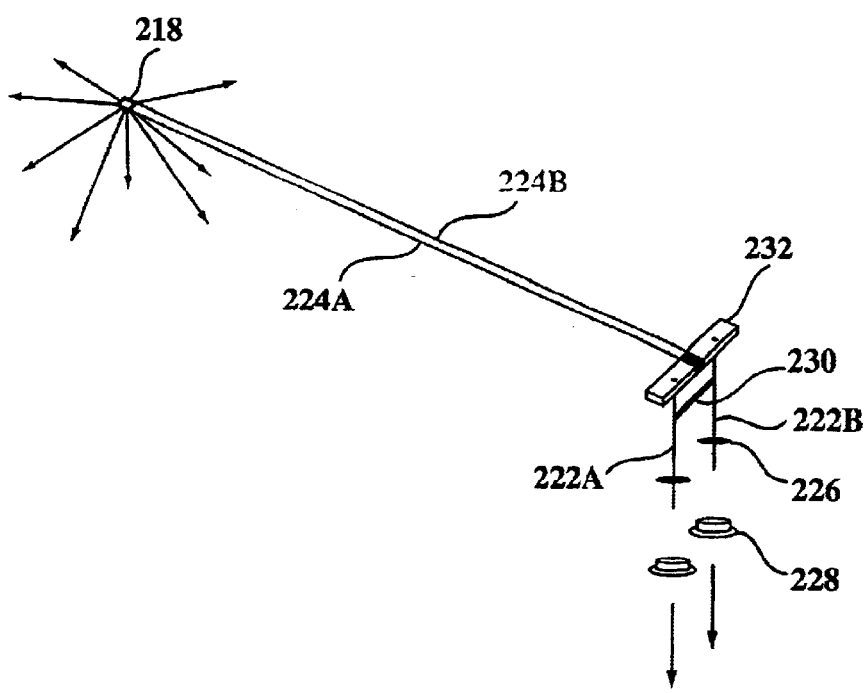
Figure 9C:
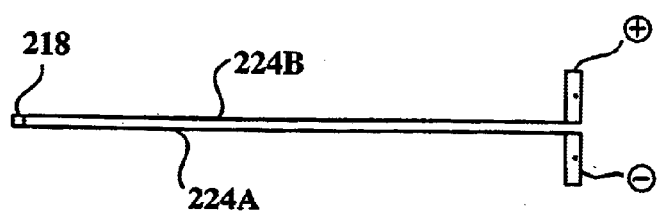
Figure 9I:
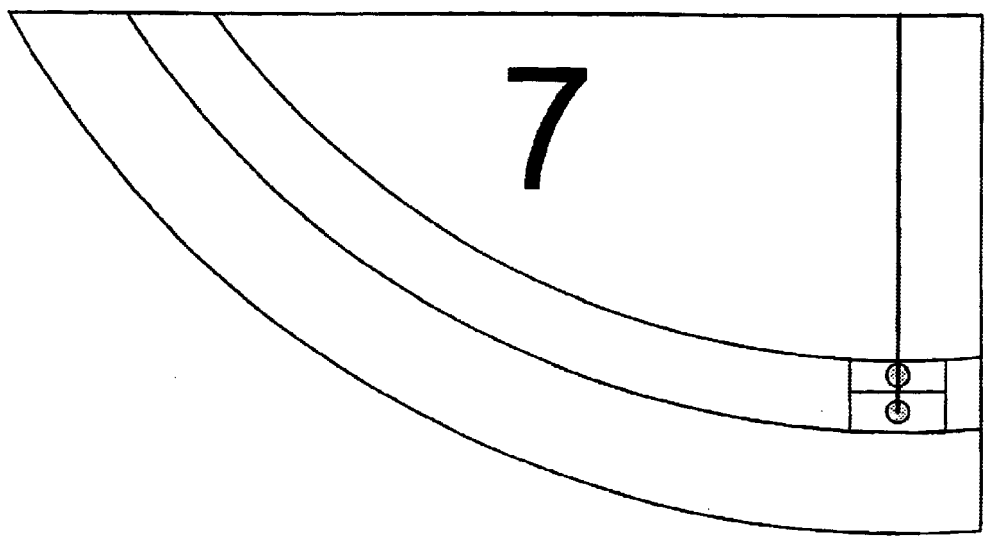
Figure 9H:
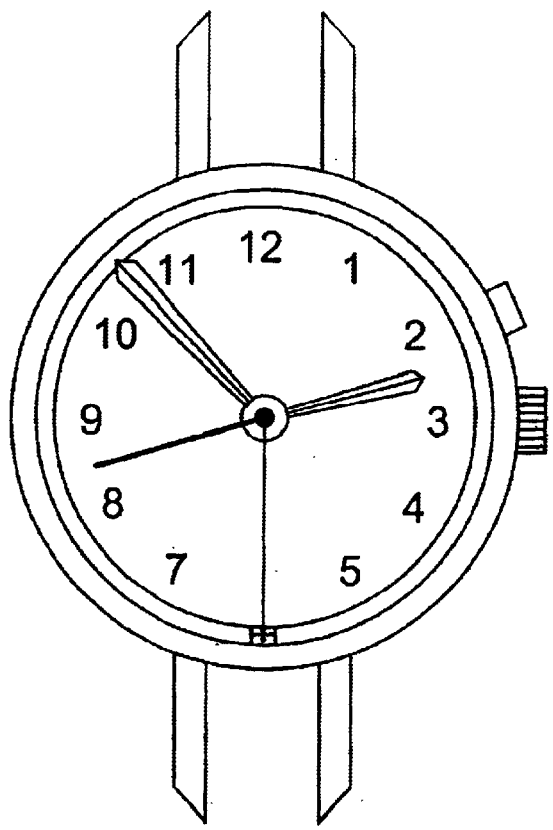

In FIG. 9E, the two conductors 224A and 224B are shown as being offset laterally. FIGS. 9G, 9H and 9I show a different conductor arrangement wherein the two conductors 224A and 224B are offset vertically from each other.

Figure 10A:
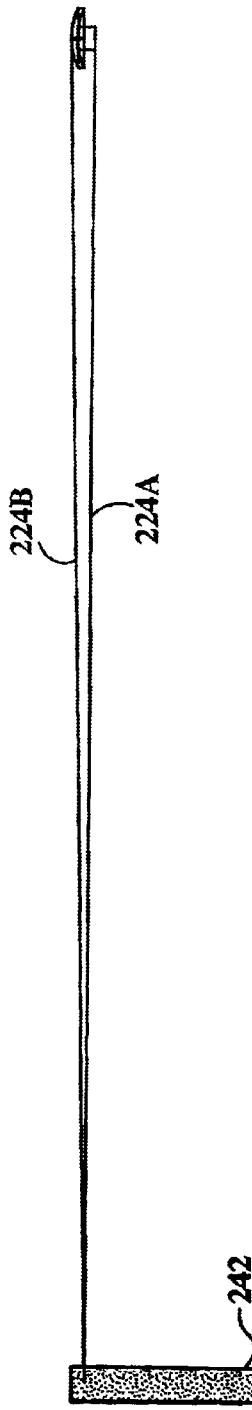
FIGS. 10A–10C show details of another conductor arrangement.
Figure 10B:
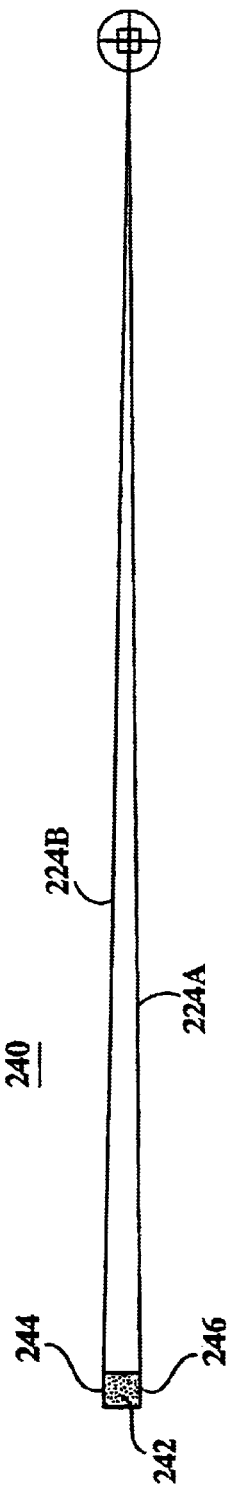
Figure 10C:
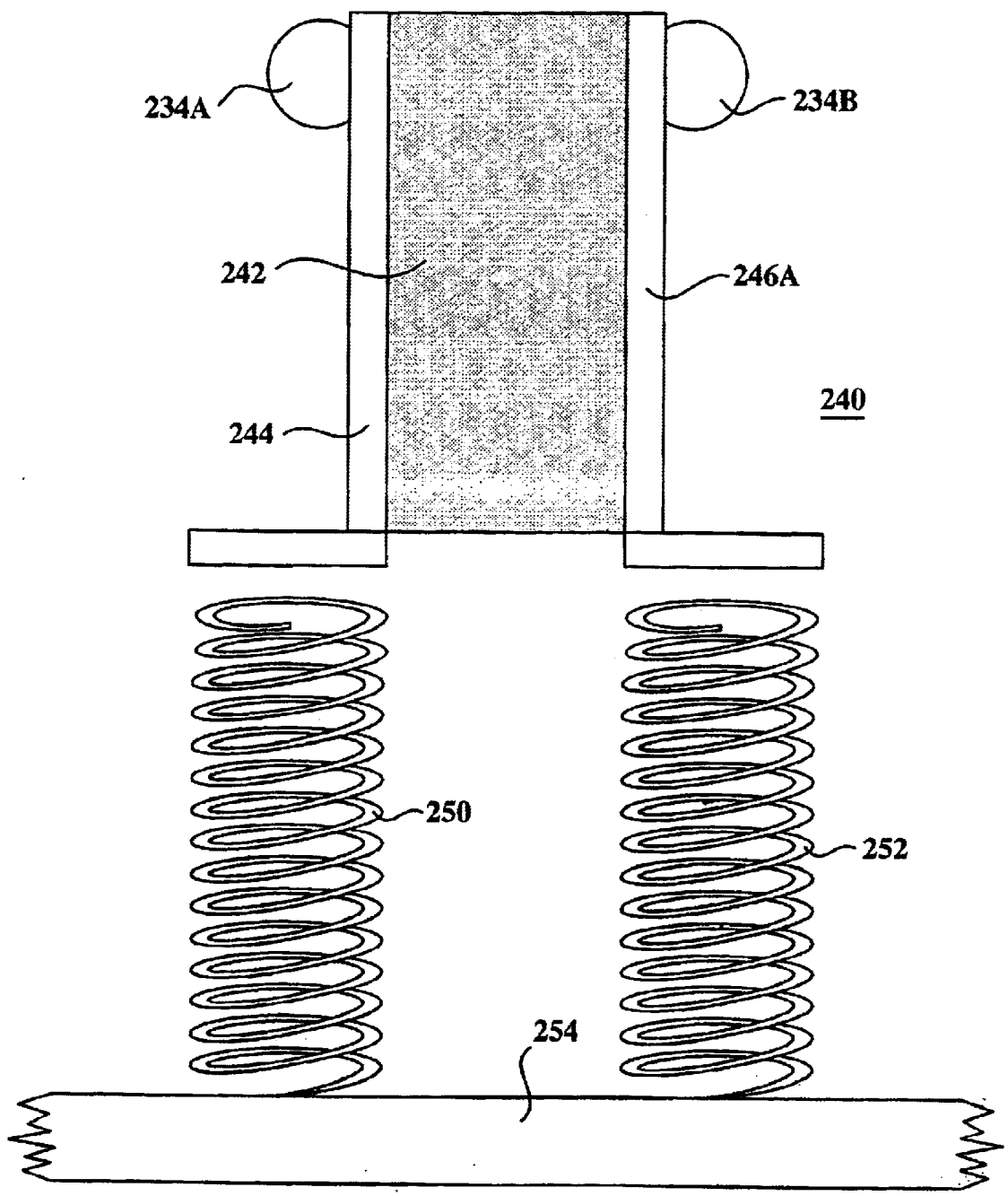

FIG. 10A discloses another conductor arrangement 240. This arrangement consists of a square post made of a non-conductive material such as aluminum oxide or other ceramic material. The post has two opposed faces 244, 246 that are coated with silver, gold or platinum to provide to conductive paths along the post. The conductors 234A, 234B are attached to these faces, using soldering or other well known means. The bottom of the post 242 has a wider portion. Two springs 250, 252 extend downwardly to the circuit board 254. The springs 250, 252 or the post 242 pass through a slot made in the dial 202. The springs 250, 252 rest against the circuit board 254 to make contact with pads(not shown) connecting the springs (and hence, the conductors 234A, 234B to other circuit elements. Thus the springs 250, 252 provide both contact means and a biasing means to urge the post upward toward the crystal. Therefore, good contact is maintained between the circuit board 254 and the coils, the coils and the post.

Figure 11:
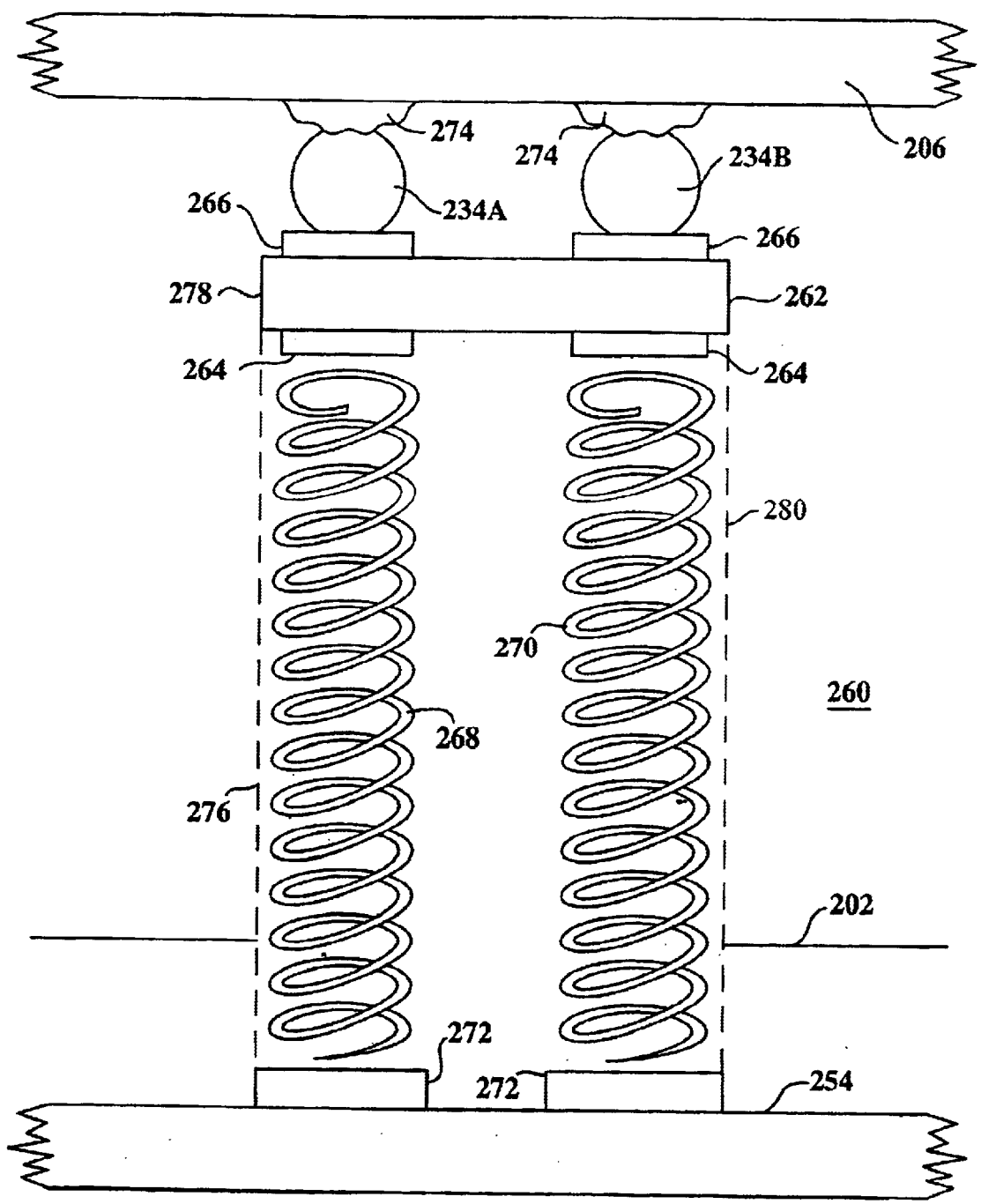
FIG. 11 shows a side elevational view of another conductor arrangement.

Another conductor arrangement is shown in FIG. 11A. This arrangement 260 includes a plate 262 which has two contact pads 264 on the bottom and two pads 266 on top. The conductors 234A and 234B are welded or otherwise attached to the top pads 266. The arrangement further includes two springs 268, 270, extending down and making contact with two pads 272 on circuit board 254. When assembled the arrangement is compressed between crystal 206 and circuit board 254. Advantageously, the plate 262 or the conductors 234A. 234B can be secured to the crystal using a UV-activated adhesive 274 or other similar means.

The arrangement 270 can be located in a number of different positions within the watch. For example, the arrangement can be positioned adjacent to the case, or a niche formed in the case. Alternatively, a hole 276 can be formed in the case with an upper shoulder 278. The springs 268, 270 can then introduced through the hole 276 so that the plate 262 rests on shoulder 278. Finally, the whole coils can be placed into a sleeve 280 and the sleeve can then be introduced into hole 276.

Figure 12:
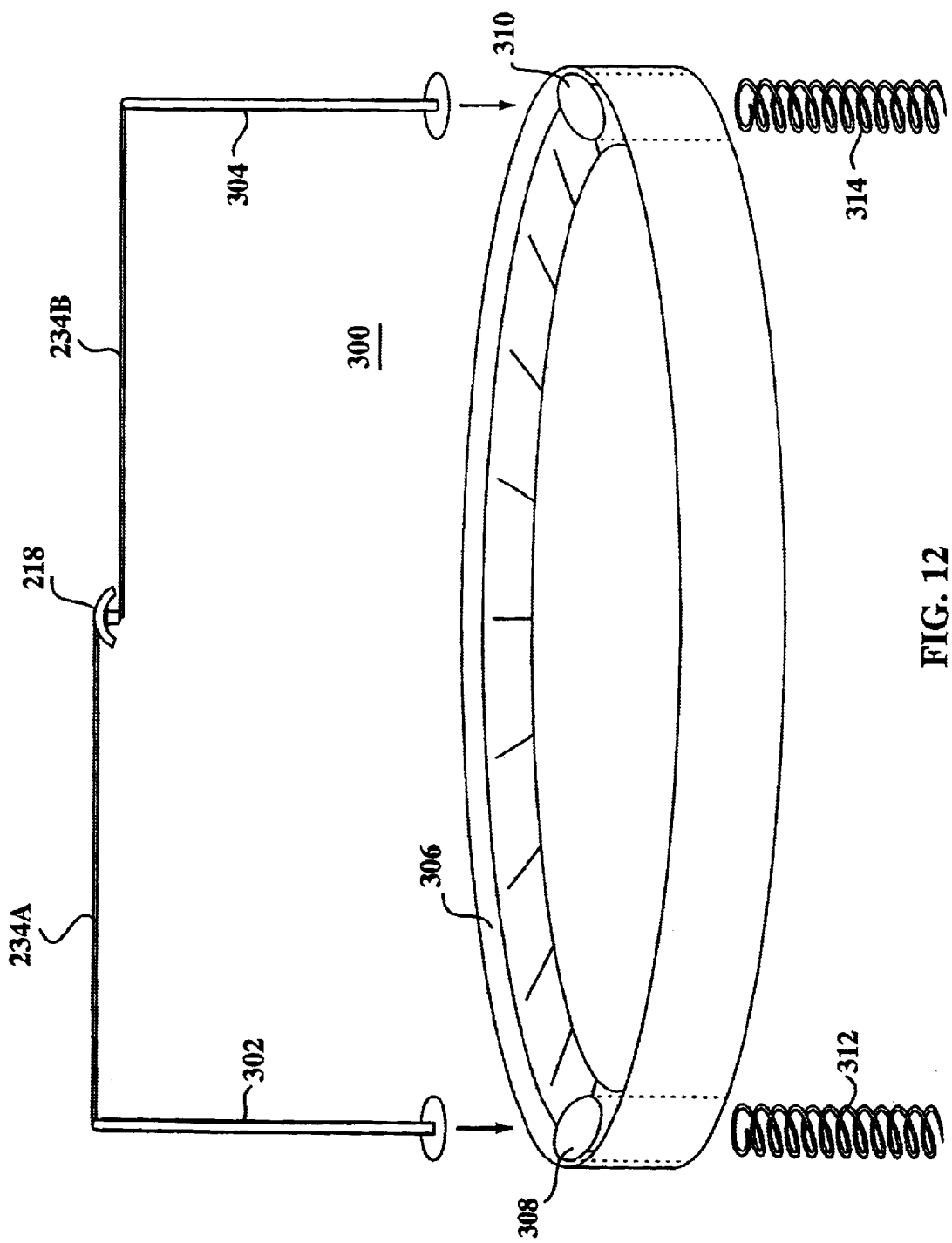
FIG. 12 shows an orthogonal view of yet another conductor arrangement.

FIG. 12 shows yet another embodiment for a conductor arrangement 300. This arrangement has the two conductors 234A, 234B extending across the watch face as shown. Each conductor is supported in a cantilevered manner by a post 302, 304. The watch is provided with a collar 306, which performs other functions as well. Two holes 308, 310 are formed in the collar 306. Two coils 312, 314 extend through the holes 308, 310 and contact the posts 302, 304 directly or through intermediate contact pads (not shown). The collar is installed under the crystal and the light emitter 218 is positioned under the crystal, and can be glued to it, as described in earlier embodiments.

G. Lateral Illumination

FIGS. 13A and 13B show a side of a watch 300 with a dial 302 carrying indicia 304 and a light emitter 306 displaced under the dial 302. A light guide 308 carries the light from light emitter 306. Adjacent to the lateral wall of the watch there are provided several mirrors, including mirror 310, 312 and 314. Mirror 310 receives the light from the emitter 306 and directs it upward to mirror 312 and/or 314. Mirrors 312 and 314 are arranged and oriented to redirect light toward the dial 302 thereby lighting the indicia 304. As can be seen in FIG. 13B, several mirrors can be placed circumferentially about the watch face, each mirror directing the light at a portion of the dial. For example, a mirror can be placed at every quadrant, e.g. 3 o'clock, 6 o'clock, 9 o'clock, 12 o'clock, etc. A single light emitter may be provided for all of the mirrors, or alternatively, more than one light emitter may be provided.

H. Indirect Illumination

Figure 14A:
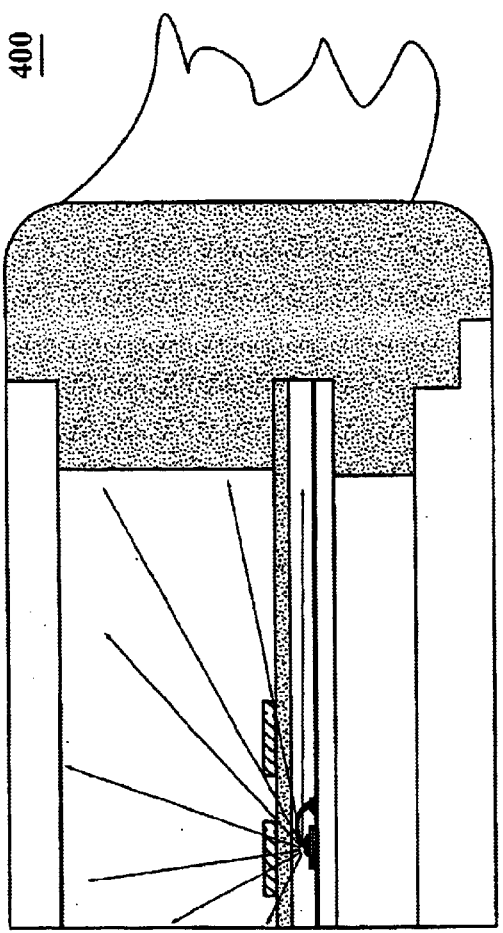
FIGS. 14A and 14B show details of a watch, instrument or other device illuminated from the bottom.
Figure 14B:
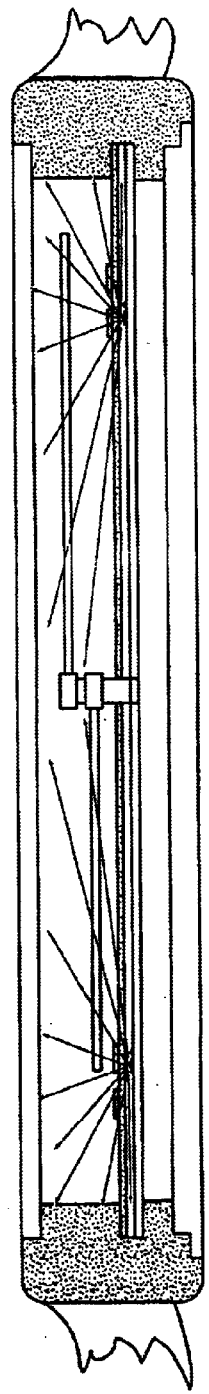

FIGS. 14A and 14B shows a configuration somewhat similar to the ones in FIGS. 13A and 13B, in that the watch 400 has a dial 402 with indicia 404 and a light emitter 406 disposed under the dial 402. In this configuration the dial is translucent and the light emitter is directed upward. As a result, when the light emitter is activated, it illuminates the translucent dial which then becomes luminous and renders the indicia 404 visible. A single light emitter may suffice, or several light emitters may be used as indicated in FIG. 14B.

I. Reflector Cones for the Electromagnetic Device

Figures 16A, 16B:
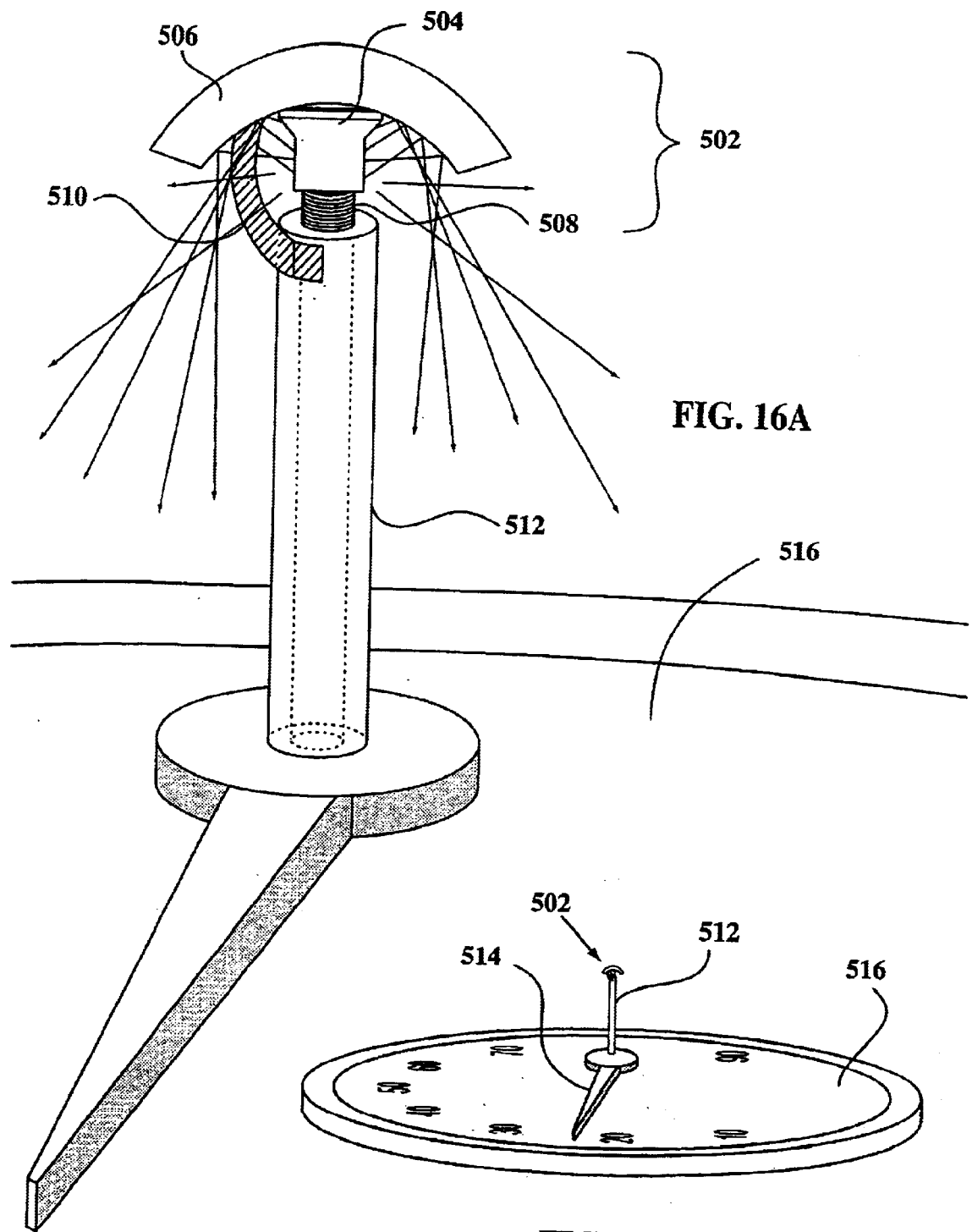
FIGS. 16A–C show details of a light emitter extending through a shaft and optionally including a reflector.

All the embodiments described above incorporate a light emitter which is preferably a lensless to provide a very broad light beam. It was found that in some instances a reflector cone may be used to shape the beam. FIGS. 16A–B shows a light emitter 502 which consists of a semiconductor junction 504 and a reflector 506. The semiconductor junction generates light along the axes indicated by the arrows. Current to the semiconductor junction is provided by conductors 508 and 510. In this embodiment, the conductor 508 is shown passing through the sleeve 512 of an instrument having a needle 514. The conductor passes through the sleeve 512 as well, or is welded to the sleeve and the sleeve serves as the current return.

Some of the light is directed along some of the horizontal axes, such as axis X. This portion of the light is wasted. In order to render the light emitter more efficient, the reflector is arranged and constructed to intercept the waste light and redirect downward toward dial 516.

Figure 16C:
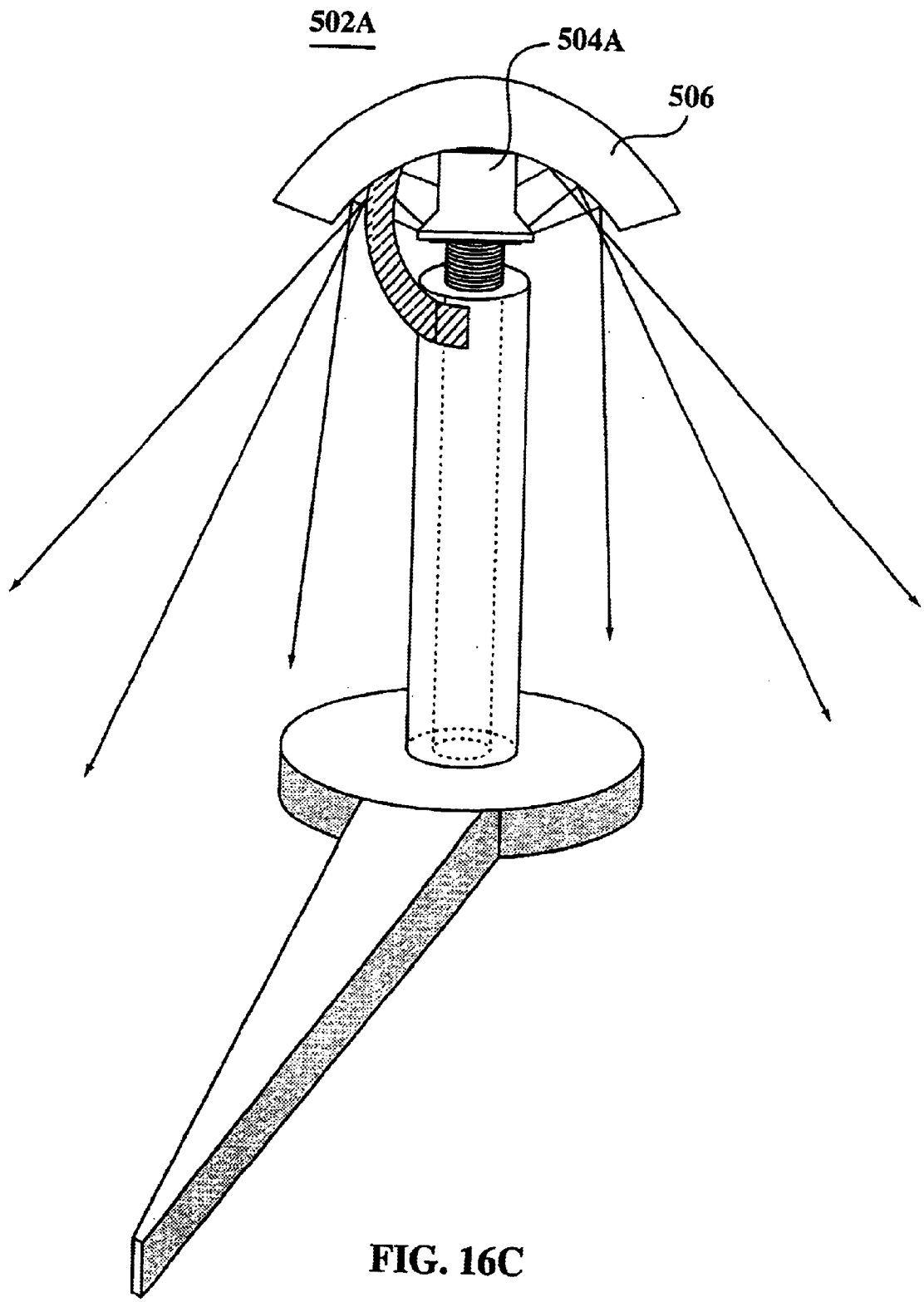

FIG. 16C shows another embodiment of the invention in which the light emitter 502A includes a semiconductor junction 504A that is inverted. In this configuration, even more light would be lost without a reflector, as shown. In this case the reflector 506 is positioned slightly higher to intercept more of the light. It should be understood that structures similar to the one shown in FIG. 16C could be used to illuminate not only gauges or instruments but watches as well. Morever, an emitter similar to 502A can be extended through any dial or backache through any hole, not just through a shaft. Moreover the shield 506 may be omitted, if desired.

Figure 15:
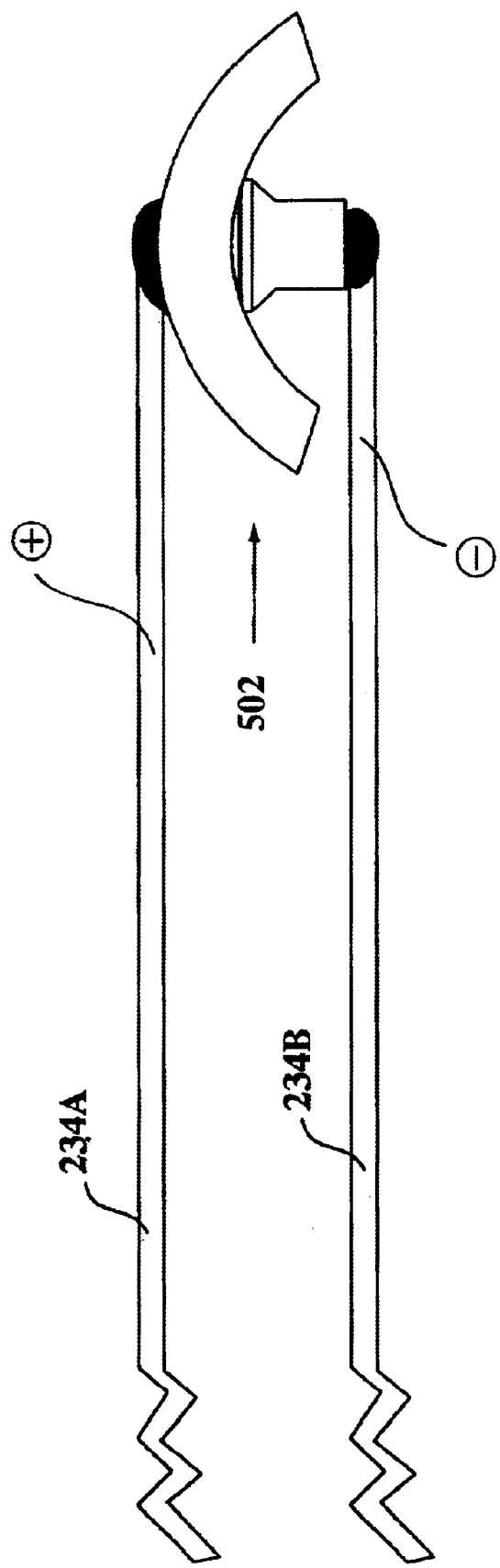
FIG. 15 shows a light emitter on a conductor arrangement with a reflector.

FIG. 15 shows the light emitter 502 supported in a cantilevered fashion by conductors 234A and 234B.

Obviously numerous modifications may be made to this invention without departing from its scope as defined in the appended claims.

We claim:

1. In a watch having a case with a dial and a crystal disposed on top of said dial, an illumination apparatus comprising:
   a radiation emitter disposed in said watch and including a lensless semiconductor junction adapted to generate radiation in the UV region and generating a broad UV light beam; and
   at least one indicia disposed on said dial, said indicia being responsive to said UV light beam, wherein said indicia is made of a material selected from the group consisting of a phosphorescent and fluorescent material.

2. The apparatus of claim 1 wherein said dial is transparent.

3. The illumination apparatus of claim 1 wherein said radiation emitter is arranged to direct said UV beam laterally from sidewalls of said case.

4. An ornamental device comprising:
   a case having a base and a transparent cover, with an image affixed to said base and visible through said cover, said image including image elements responsive to UV light, said image elements being made of a material selected from the group consisting of a phosohorescent and fluorescent material; and
   a radiation emitter disposed above said base and including a lensless semiconductor junction arranged to form a UV light beam directed to said image.

5. The ornamental device of claim 4 wherein said radiation emitter includes a semiconductor junction adapted to emit UV radiation.

6. In a vehicle having at least one device, an illumination apparatus comprising:
   a radiation emitter disposed in said vehicle and including a semiconductor junction without a focusing lens adapted to generate a wide UV beam; and
   indicia responsive to said UV beam and attached to said device, said indicia being made of a material selected from the group consisting of a phosphorescent and fluorescent material.

7. The apparatus of claim 6 wherein said device is an instrument having a dial and said indicia is attached to said dial.

8. The apparatus of claim 7 wherein said instrument includes a transparent, cover extending on said dial and said radiation emitter is mounted on said cover.

9. The apparatus of claim 8 further comprising several radiation emitters, each emitter generating beams toward said indicia.

10. The apparatus of claim 6 wherein the vehicle has a structural member remote from the device and wherein said radiation emitter is attached to the structural member.

11. The apparatus of claim 10 wherein the vehicle has a roof and said radiation emitter is attached to the roof.

12. The apparatus of claim 6 wherein said device is an instrument having a moving member and said indicia is attached to said moving member.

13. In a watch having a case with a dial and a crystal disposed on top of said dial, an illumination apparatus comprising:
   a radiation emitter disposed in said watch and including a semiconductor junction adapted to generate radiation in the UV region and generating a broad UV beam; and
   at least one indicia disposed on said dial, said indicia being responsive to said UV beam, wherein said indicia is made of a material selected from the group consisting of a phosphorescent and fluorescent material.

14. In a vehicle having at least one device, an illumination apparatus comprising:

a radiation emitter disposed in said device including a semiconductor junction adapted to generate a wide UV beam; and indicia responsive to said UV beam and attached to said device, said indicia being made of a material selected from the group consisting of a phosphorescent and fluorescent material.

15. An apparatus for providing illumination for an electronic device having a plurality keys, comprising:

a radiation emitter including a semiconductor junction adapted to generate a wide UV beam; and indicia associated with said keys and responsive to said UV beam, said indicia being made of a material selected from the group consisting of a phosphorescent and fluorescent material.

16. The apparatus of claim 15 wherein said device is a keyboard.

17. The apparatus of claim 15 wherein said device is a hand held device.

18. The apparatus of claim 15 wherein said electronic device includes an accessory port, said apparatus further comprising an elongated flexible member having the radiation emitter at one end and a coupler at the other end for coupling with said accessory port.

19. The apparatus of claim 18 wherein said coupler is a USB connector.

20. The apparatus of claim 15 wherein said indicia is attached to the keys.

* * * * *

(12) EX PARTE REEXAMINATION CERTIFICATE (6268th)
United States Patent
Fuwausa et al.

(10) Number: US 6,729,738 C1
(45) Certificate Issued: Jun. 17, 2008

(54) ILLUMINATION DEVICES FOR WATCHES AND OTHER INSTRUMENTS

(75) Inventors: Michelle Jillian Fuwausa, Columbia, MD (US); James L. Thompson, Arlington, TX (US)

(73) Assignee: Luminary Logic, Inc., Columbia, MD (US)

Reexamination Request:
No. 90/007,030, May 4, 2004

Reexamination Certificate for:
Patent No.: 6,729,738
Issued: May 4, 2004
Appl. No.: 10/139,660
Filed: May 3, 2002

Related U.S. Application Data

(60) Provisional application No. 60/288,330, filed on May 3, 2001, provisional application No. 60/298,984, filed on Jun. 18, 2001, and provisional application No. 60/315,323, filed on Aug. 28, 2001.

(51) Int. Cl.
| | |
|---|---|
| B60K 37/02 | (2006.01) |
| B60Q 3/02 | (2006.01) |
| B60Q 3/04 | (2006.01) |
| B60Q 3/00 | (2006.01) |
| G01D 13/20 | (2006.01) |
| G01D 13/00 | (2006.01) |
| G01D 13/28 | (2006.01) |
| G04G 9/00 | (2006.01) |
| G09F 3/10 | (2006.01) |
| G09F 13/20 | (2006.01) |
| H01L 33/00 | (2006.01) |
| F21V 33/00 | (2006.01) |
| F21V 9/16 | (2006.01) |
| F21L 4/00 | (2006.01) |
| G04B 19/30 | (2006.01) |
| G04C 17/00 | (2006.01) |
| G04C 17/02 | (2006.01) |

(52) U.S. Cl. .............. 362/84; 250/461.1; 257/E33.066; 257/E33.072; 362/23

(58) Field of Classification Search .............. 362/84, 362/23, 85, 800, 28, 30, 29, 806, 490, 493; 250/458.1, 461.1, 462.1, 463.1, 465.1, 466.1, 250/483.1; 40/542, 543; 368/24, 67, 227; 257/E33.066, E33.072
See application file for complete search history.

(56) References Cited

U.S. PATENT DOCUMENTS

| 4,115,994 A | * | 9/1978 | Tomlinson .................. 368/241 |
|---|---|---|---|
| 4,561,042 A | | 12/1985 | Wehner et al. |
| 4,899,453 A | | 2/1990 | Bhat et al. |
| 5,477,430 A | * | 12/1995 | LaRose ........................ 362/84 |
| 5,703,837 A | | 12/1997 | Umemoto et al. |
| 5,899,553 A | * | 5/1999 | Howell ......................... 362/84 |
| 6,106,127 A | | 8/2000 | Fuwausa |
| 6,145,209 A | | 11/2000 | Chang |
| 6,299,321 B1 | | 10/2001 | Fuwausa |
| 6,335,548 B1 | * | 1/2002 | Roberts et al. ................ 257/98 |
| 6,575,593 B2 | * | 6/2003 | Krietzman .................. 362/199 |
| 6,883,926 B2 | * | 4/2005 | Wojnarowski ............... 362/84 |
| 2002/0186556 A1 | * | 12/2002 | Wojnarowski ............... 362/84 |

OTHER PUBLICATIONS

The Engineering Handbook, Second Edition, Boca Raton, FL., CRC Press, 2005, chapter 119, pp. 24 and 25, [retrieved on Sep. 21, 2006]. Retrieved from the Internet: <URL: http://www.engnetbase.com/books/1550/1586_C119.pdf>.*

* cited by examiner

*Primary Examiner*—Sara S Clarke

(57) ABSTRACT

A UV emitter is incorporated into a variety of different illumination devices suitable for illuminating indicia associated with dials on watches, gauges and other instruments, as well as ornaments. The indicia is made of a material responsive to UV emissions to render the indicia visible. The devices may be used in motor vehicles and other devices. In addition, a conductor arrangement is also provided that can be used to support the UV emitter under the transparent cover of watches or gauges, with the UV emitter oriented to direct the UV emissions toward the indicia. Embodiments are presented for UV emitters on top of dials with indicia, laterally from the dials, or even under the dials.

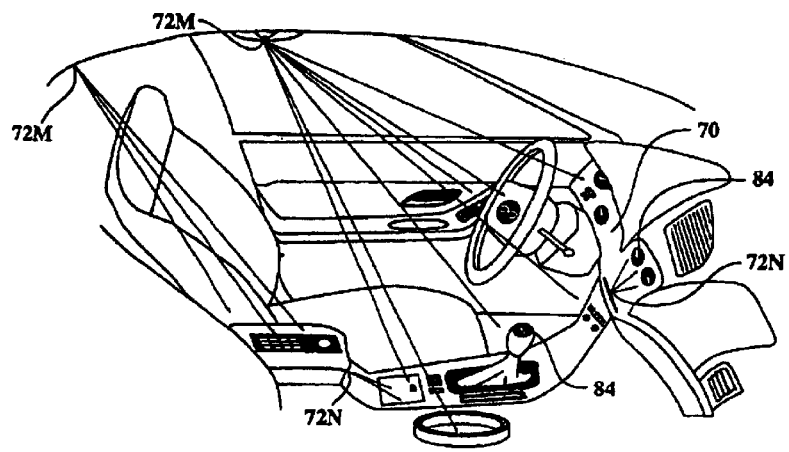

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–9 and 12–14 are cancelled.

Claims 10 and 15 are determined to be patentable as amended.

Claims 11 and 16–20, dependent on an amended claim, are determined to be patentable.

10. [The apparatus of claim 6] *In a vehicle having at least one device, an illumination apparatus comprising:*

*a radiation emitter disposed in said vehicle and including a semiconductor junction without a focusing lens adapted to generate a wide UV beam; and indicia responsive to said UV beam and attached to said device, said indicia being made of a material selected from the group consisting of a phosphorescent and fluorescent material;* wherein the vehicle has a structural member remote from the device and wherein said radiation emitter is attached to the structural member.

15. An apparatus for providing illumination for an electronic device having a plurality keys, comprising:

a radiation emitter including a *lensless* semiconductor junction adapted to generate a wide UV beam, *said radiation emitter being arranged to direct the UV beam from a location remote from said plurality of keys, said beam being incident on said plurality of keys*; and indicia associated with said keys and responsive to said UV beam, said indicia being made of a material selected from the group consisting of a phosphorescent and fluorescent material.

* * * * *